(12) United States Patent
Park et al.

(10) Patent No.: US 12,113,129 B2
(45) Date of Patent: Oct. 8, 2024

(54) SEMICONDUCTOR DEVICE, ARRAY STRUCTURE OF SEMICONDUCTOR DEVICES, NEUROMORPHIC CIRCUIT INCLUDING THE SEMICONDUCTOR DEVICES, AND COMPUTING APPARATUS INCLUDING THE NEUROMORPHIC CIRCUIT

(71) Applicant: Samsung Electronics Co., Ltd., Suwon-si (KR)

(72) Inventors: Jaechul Park, Yongin-si (KR); Youngkwan Cha, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 238 days.

(21) Appl. No.: 17/716,460

(22) Filed: Apr. 8, 2022

(65) Prior Publication Data
US 2023/0040335 A1 Feb. 9, 2023

(30) Foreign Application Priority Data
Aug. 5, 2021 (KR) .......................... 10-2021-0103477

(51) Int. Cl.
| | | |
|---|---|---|
| *H01L 51/30* | (2006.01) | |
| *H01L 29/51* | (2006.01) | |
| *H01L 29/78* | (2006.01) | |
| *H10B 51/30* | (2023.01) | |

(52) U.S. Cl.
CPC ...... *H01L 29/78391* (2014.09); *H01L 29/516* (2013.01); *H10B 51/30* (2023.02)

(58) Field of Classification Search
CPC ............. H01L 29/78391; H01L 29/516; H01L 29/0673; H01L 29/42392; H01L 29/66439; H01L 29/775; H01L 29/40111; H10B 51/30; H10B 51/10; H10B 51/20; B82Y 10/00; G06N 3/063
USPC ......................................................... 257/211
See application file for complete search history.

(56) References Cited

U.S. PATENT DOCUMENTS

| | | | |
|---|---|---|---|
| 7,112,521 B1 * | 9/2006 | Lin ...................... | H01L 21/4832 257/738 |
| 7,816,242 B2 | 10/2010 | Ono | |
| 8,461,035 B1 * | 6/2013 | Cronquist ............. | H01L 29/785 438/599 |
| 10,374,086 B2 | 8/2019 | Hu | |
| 10,600,808 B2 * | 3/2020 | Schröder ................. | H01L 28/40 |
| 10,998,339 B2 | 5/2021 | Morris et al. | |
| RE49,015 E * | 4/2022 | Shin ....................... | H01L 28/55 |
| 11,443,792 B1 * | 9/2022 | Iqbal ..................... | G11C 11/221 |
| 2002/0149042 A1 * | 10/2002 | Tarui ................. | H01L 29/40111 257/295 |

(Continued)

FOREIGN PATENT DOCUMENTS

KR 10-1811807 B1 11/2012

*Primary Examiner* — Sheikh Maruf
(74) *Attorney, Agent, or Firm* — Harness, Dickey & Pierce, P.L.C.

(57) ABSTRACT

A semiconductor device includes a semiconductor layer extending in a first direction and including a source region and a drain region, which are apart from each other in the first direction; an insulating layer surrounding the semiconductor layer; a first gate electrode layer surrounding the insulating layer; a ferroelectric layer provided on the first gate electrode layer; and a second gate electrode layer provided on the ferroelectric layer.

20 Claims, 16 Drawing Sheets

(56) References Cited

U.S. PATENT DOCUMENTS

| | | | | |
|---|---|---|---|---|
| 2007/0141762 A1* | 6/2007 | Hyde | ...................... | B82Y 10/00 438/130 |
| 2009/0061610 A1* | 3/2009 | Ono | ................... | H01L 29/7854 438/591 |
| 2010/0090253 A1* | 4/2010 | Byrn | ...................... | B82Y 10/00 257/209 |
| 2010/0187502 A1* | 7/2010 | Gambino | ............. | H10K 10/482 438/151 |
| 2010/0259960 A1* | 10/2010 | Samachisa | ........... | G11C 13/003 257/E47.001 |
| 2011/0021016 A1* | 1/2011 | Awano | ................... | H01L 24/16 257/E21.506 |
| 2011/0073827 A1* | 3/2011 | Rubloff | ............... | H01L 29/0676 438/129 |
| 2011/0204432 A1* | 8/2011 | Chen | ....................... | G03F 7/165 257/E29.309 |
| 2012/0061648 A1* | 3/2012 | Dehon | ................... | H10K 10/80 257/15 |
| 2012/0329253 A1* | 12/2012 | Koto | ................. | H01L 21/02639 977/762 |
| 2013/0075701 A1* | 3/2013 | Huang | ........... | H01L 21/823828 257/29 |
| 2013/0146878 A1* | 6/2013 | Oh | ....................... | H10K 50/852 977/773 |
| 2015/0310905 A1* | 10/2015 | Karda | ................... | H10B 43/30 257/295 |
| 2016/0118989 A1* | 4/2016 | Bramanti | .......... | H01L 27/11803 977/890 |
| 2016/0268271 A1* | 9/2016 | Mueller | ............. | H01L 29/6684 |
| 2017/0162702 A1* | 6/2017 | Hu | ..................... | H01L 29/42384 |
| 2019/0273087 A1* | 9/2019 | Morris | .................. | G11C 11/223 |
| 2020/0312978 A1* | 10/2020 | Kavalieros | ............ | H01L 29/516 |
| 2021/0408022 A1* | 12/2021 | Young | ................. | H01L 29/0673 |
| 2022/0102558 A1* | 3/2022 | Yamaguchi | ........... | H01L 29/516 |

* cited by examiner $$V_{FE} = V_{GS} * \left(1 + \frac{C_{FE}}{C_{DE}}\right)^{-1}$$

$$V_{DE} = V_{GS} * \left(1 + \frac{C_{DE}}{C_{FE}}\right)^{-1}$$

SEMICONDUCTOR DEVICE, ARRAY STRUCTURE OF SEMICONDUCTOR DEVICES, NEUROMORPHIC CIRCUIT INCLUDING THE SEMICONDUCTOR DEVICES, AND COMPUTING APPARATUS INCLUDING THE NEUROMORPHIC CIRCUIT

CROSS-REFERENCE TO RELATED APPLICATION

This application is based on and claims priority under 35 U.S.C. § 119 to Korean Patent Application No. 10-2021-0103477, filed on Aug. 5, 2021, in the Korean Intellectual Property Office, the disclosure of which is incorporated by reference herein in its entirety.

BACKGROUND

Some example embodiments relate to semiconductor devices, array structures of the semiconductor devices, circuits including the semiconductor devices, and/or computing apparatuses including the neuromorphic circuits, and more particularly, to semiconductor devices each including an insulating layer and a floating gate electrode layer, which surround a semiconductor layer; array structures of the semiconductor devices; neuromorphic circuits including the semiconductor devices; and/or computing apparatuses including the neuromorphic circuits.

Dynamic random-access memory (DRAM) devices include a capacitor configured to store a charge and an access or selection transistor configured to switch the capacitor. DRAM devices are each capable of expressing binary digits 1 and 0 based on the presence or absence of a charge stored in a capacitor.

A structure in which a transistor is on a two-dimensional flat surface and a capacitor having a cylindrical shape is vertically on the transistor, is known as a DRAM device structure. It may be required or desired to reduce not only the size of transistors but also the size of capacitors for increasing the degree of integration of an integrated circuit in which DRAM devices are integrated. However, capacitors each having a size greater than or equal to a certain size are necessary or expected to store a required amount of charge, and there is a limit to decreasing the size of selection transistors because of issues such as an increase in gate line resistance and/or a short channel effect, etc. In addition, because such DRAM devices include capacitors, three-dimensionally stacking the DRAM devices may be difficult.

However, ferroelectric field effect transistors (FeFETs) are capable of expressing binary digits 1 and 0 without using capacitors and are thus more easily stacked in a three-dimensional form.

A metal-ferroelectric-insulator-semiconductor (MFIS) structure is known as a structure of FeFETs. The endurance of FeFETs having an MFIS structure is about $10^5$ cycles (about 100,000 cycles), and thus FeFETs having an MFIS structure are unsuitable for being applied to DRAM devices, which require or expects an endurance of $10^{10}$ cycles or more (about 10 trillion cycles or more). The endurance of FeFETs having an MFIS structure may be poor because the memory windows of the FeFETs disappear due to a charge trapping phenomenon occurring from an insulating layer toward a ferroelectric layer by a high voltage applied to the insulating layer.

In addition, a metal-ferroelectric-metal-insulator-semiconductor (MFMIS) structure is known as a structure of FeFETs, which improves the endurance of FeFETs by reducing a charge trapping phenomenon occurring in a ferroelectric layer. In an FeFET having an MFMIS structure, the ratio of ferroelectric layer capacitance $C_{FE}$ between a control gate electrode layer and a floating gate electrode layer, which are apart from each other with a ferroelectric layer therebetween, and insulating layer capacitance $C_{DE}$ between the floating gate electrode layer and a semiconductor layer, which are apart from each other with an insulating layer between the floating gate layer and the semiconductor layer, may be adjusted to apply a low voltage to the insulating layer and thus to reduce the occurrence of charge trapping in the ferroelectric layer. However, to adjust the ratio of the ferroelectric layer capacitance $C_{FE}$ and the insulating layer capacitance $C_{DE}$, it may be necessary or desirable to reduce the size of the ferroelectric layer and/or increase the size of the insulating layer, causing an increase in process difficulty or a decrease in the degree of integration of FeFETs.

SUMMARY

Provided are three-dimensional semiconductor devices having high endurance and a high degree of integration, array structures of the semiconductor devices, neuromorphic circuits including the semiconductor devices, and/or computing apparatuses including the neuromorphic circuits.

Additional aspects will be set forth in part in the description which follows and, in part, will be apparent from the description, or and/may be learned by practice of the example embodiments.

According to some example embodiments, a semiconductor device includes: a semiconductor layer extending in a first direction and including a source region and a drain region, which are apart from each other in the first direction; an insulating layer surrounding the semiconductor layer; a first gate electrode layer surrounding the insulating layer; a ferroelectric layer on the first gate electrode layer; and a second gate electrode layer on the ferroelectric layer.

Between the source region and the drain region, a ratio C2/C1 of second capacitance C2 between the first gate electrode layer and the second gate electrode layer to first capacitance C1 between the semiconductor layer and the first gate electrode layer may be about 1/20 to about 1/5.

The insulating layer and the first gate electrode layer may have an all-around shape surrounding the semiconductor layer.

A first ratio $r1=\varepsilon1/t1$ of a first dielectric constant $\varepsilon1$ of the insulating layer to a first thickness t1 of the insulating layer may be equal to a second ratio $r2=\varepsilon2/t2$ of a second dielectric constant $\varepsilon2$ of the ferroelectric layer to a second thickness t2 of the ferroelectric layer.

A ratio A2/A1 of a second area A2 of a surface of the ferroelectric layer, which contacts the first gate electrode layer between the source region and the drain region, to a first area A1 of a surface of the insulating layer, which contacts with the first gate electrode layer between the source region and the drain region, may be about 1/20 to about 1/5.

A length of the ferroelectric layer in the first direction may be about 10 nm to about 20 nm.

A first length of the insulating layer in the first direction between the source region and the drain region may be greater than a second length of the ferroelectric layer in the first direction between the source region and the drain region.

A second width of the ferroelectric layer in a second direction crossing the first direction may be equal to a third width of the first gate electrode layer in the second direction.

A second width of the ferroelectric layer in a second direction crossing the first direction may be greater than a third width of the first gate electrode layer in the second direction.

A second length of the ferroelectric layer in the first direction may be equal to a third length of the second gate electrode layer in the first direction.

A second width of the ferroelectric layer in a second direction crossing the first direction may be equal to a fourth width of the second gate electrode layer in the second direction.

The semiconductor layer may include: a front surface and a rear surface which are opposite each other in a second direction crossing the first direction; and an upper surface and a lower surface which are opposite each other in a third direction perpendicular to both the first direction and the second direction. The insulating layer may surround the semiconductor layer and may be in contact with the front surface, the rear surface, the upper surface, and the lower surface of the semiconductor layer.

The first direction and the second direction may be perpendicular to each other.

The ferroelectric layer and the second gate electrode layer may cover the first gate electrode layer on a side of the upper surface of the semiconductor layer.

The ferroelectric layer and the second gate electrode layer may extend to cover the first gate electrode layer on a side of the front surface and on a side of the rear surface of the semiconductor layer.

According to some example embodiments, a semiconductor device array structure includes: a plurality of gate lines arranged side by side in a first direction and each extending in a second direction; a plurality of semiconductor structures arranged side by side in the second direction and crossing the plurality of gate lines, each of the plurality of semiconductor structures extending in the first direction; and a plurality of ferroelectric structures provided between the plurality of gate lines and the plurality of semiconductor structures.

Each of the plurality of semiconductor structures may include a semiconductor layer extending in the first direction and including a plurality of source regions and a plurality of drain regions which are apart from each other in the first direction, an insulating layer surrounding the semiconductor layer, and a first gate electrode layer surrounding the insulating layer.

Between a first drain region and a first source region which are adjacent to each other among the plurality of source regions and the plurality of drain regions, a ratio C2/C1 of second capacitance C2 between the first gate electrode layer and one of the plurality of gate lines, which is adjacent to the first gate electrode layer, to first capacitance C1 between the semiconductor layer and the first gate electrode layer may be about 1/20 to about 1/5.

The plurality of ferroelectric structures may be side by side in the first direction, and each of the plurality of ferroelectric structures may extend in the second direction.

The plurality of ferroelectric structures may be apart from each other and may be at a plurality of crossing points between the plurality of gate lines and the plurality of semiconductor structures.

According some example embodiments, a neuromorphic circuit includes: a pre-synaptic neuron circuit; a pre-synaptic line extending in a first direction from the pre-synaptic neuron circuit; a post-synaptic neuron circuit; a post-synaptic line extending from the post-synaptic neuron circuit in a second direction crossing the first direction; and a synaptic circuit at an intersection between the pre-synaptic line and the post-synaptic line.

The synaptic circuit may include a semiconductor device including a semiconductor layer extending in the first direction and including a source region and a drain region, which are apart from each other in the first direction; an insulating layer surrounding the semiconductor layer; a first gate electrode layer surrounding the insulating layer; a ferroelectric layer on the first gate electrode layer; and a second gate electrode layer on the ferroelectric layer.

Between the source region and the drain region, a ratio C2/C1 of second capacitance C2 between the first gate electrode layer and the second gate electrode layer to first capacitance C1 between the semiconductor layer and the first gate electrode layer may be about 1/20 to about 1/5.

A first ratio $r1=\varepsilon1/t1$ of a first dielectric constant $\varepsilon1$ of the insulating layer to a first thickness $t1$ of the insulating layer may be equal to a second ratio $r2=\varepsilon2/t2$ of a second dielectric constant $\varepsilon2$ of the ferroelectric layer to a second thickness $t2$ of the ferroelectric layer.

A ratio A2/A1 of a second area A2 of a surface of the ferroelectric layer, which is in contact with the first gate electrode layer between the source region and the drain region, to a first area A1 of a surface of the insulating layer, which is in contact with the first gate electrode layer between the source region and the drain region, may be about 1/20 to about 1/5.

According to some example embodiments, a neuromorphic computing apparatus includes an input device; the neuromorphic circuit configured to store and output specific information by using a signal from the input device; and a processor configured to process information output from the neuromorphic circuit.

BRIEF DESCRIPTION OF THE DRAWINGS

The above and other aspects, features, and/or advantages of certain example embodiments will be more apparent from the following description taken in conjunction with the accompanying drawings, in which.

DETAILED DESCRIPTION

Figures 1, 2:
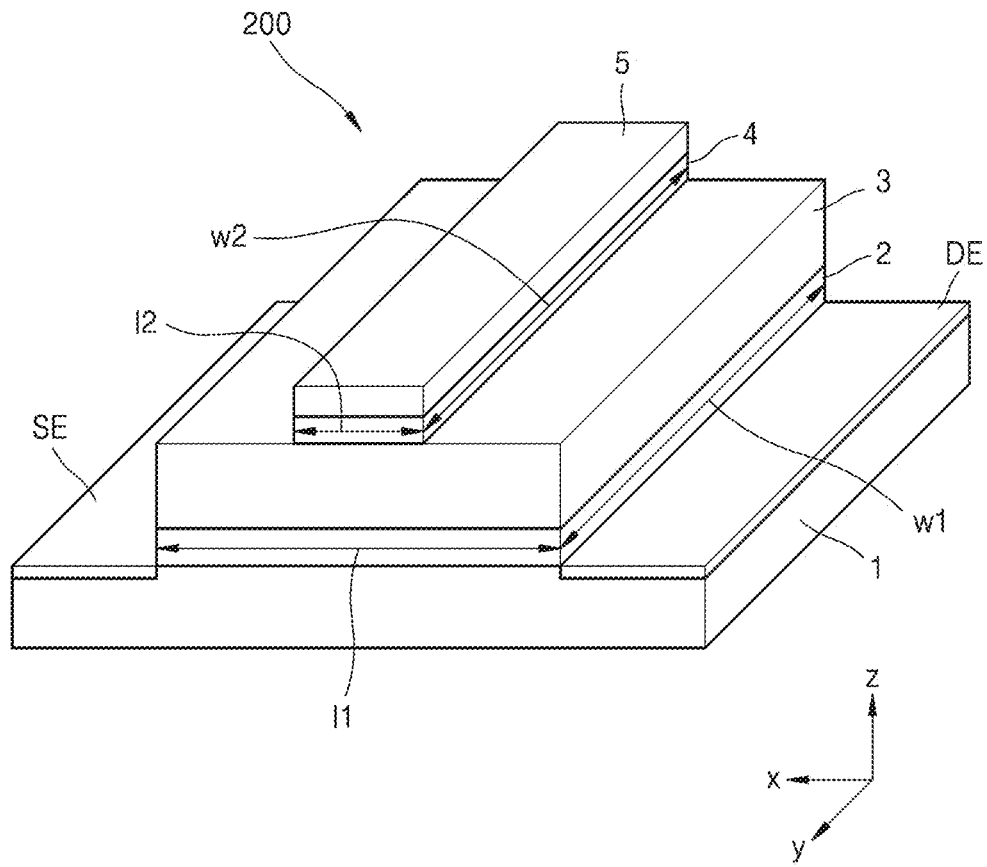
FIG. 1 is a view schematically illustrating an example structure of a semiconductor device having a metal-ferroelectric-metal-insulator-semiconductor (MFMIS) structure according to a comparative example.
FIG. 2 is a view illustrating gate voltage distribution equations for a semiconductor device having an MFMIS structure.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, the sizes of elements may be exaggerated for clarity of illustration.

It will be understood that although terms such as "first" and "second" are used herein to describe various elements, these elements should not necessarily be limited by these terms. These terms are only used to distinguish one element from other elements.

In the following description, when an element is referred to as being "above" or "on" another element, the element may be directly on the other element while making contact with the other element or may be above the other element without making contact with the other element. The terms of a singular form may include plural forms unless otherwise mentioned.

It will be further understood that the terms "comprises" and/or "comprising" used herein specify the presence of stated features or elements, but do not necessarily preclude the presence or addition of one or more other features or elements.

An element referred to with the definite article and/or a demonstrative pronoun may be construed as the element or the elements even though it has a singular form.

Operations of a method may be performed in an appropriate order unless explicitly described in terms of order or described to the contrary. In addition, examples or other such terms (for example, "such as" and "etc.") are used for the purpose of description and are not intended to limit the scope of example embodiments unless defined by the claims.

FIG. 1 is a view schematically illustrating an example structure of a semiconductor device 200 having a metal-ferroelectric-metal-insulator-semiconductor (MFMIS) structure according to a comparative example. FIG. 2 is a view illustrating gate voltage distribution equations for the semiconductor device 200 having an MFMIS structure. FIG. illustrates graphs showing threshold voltage variations with respect to the number of program-erase cycles performed on the semiconductor device 200 having an MFMIS structure for different ratios of ferroelectric layer capacitance $C_{FE}$ and insulating layer capacitance $C_{DE}$ of the semiconductor device 200 having an MFMIS structure.

Referring to FIG. 1, in the semiconductor device 200 having an MFMIS structure, a semiconductor layer 1, an insulating layer 2, a floating gate electrode layer 3, a ferroelectric layer 4, and a control gate electrode layer 5 may be sequentially stacked. A source electrode SE and a drain electrode DE, which are apart from each other with the insulating layer 2 therebetween, may be further provided on the semiconductor layer 1. All of the semiconductor layer 1, the insulating layer 2, the floating gate electrode layer 3, the ferroelectric layer 4, and the control gate electrode layer 5 may be formed in a thin film form.

The insulating layer 2 may have a first length l1 in a first direction x (e.g. a "channel length" direction) and a first width w1 in a second direction y crossing the first direction x (e.g. a "channel width" direction). The ferroelectric layer 4 may have a second length l2 in the first direction x and a second width w2 in the second direction y. The first length l1 may be the same as, greater than, or less than the first width w1; the second width w2 may be the same as, greater than, or less than the second width w2.

Referring to FIG. 2, a gate voltage $V_{GS}$ applied to the control gate electrode layer 5 may be differently distributed to the ferroelectric layer 4 and the insulating layer 2 according to the ratio of the ferroelectric layer capacitance $C_{FE}$ between the control gate electrode layer 5 and the floating gate electrode layer 3 and the insulating layer capacitance $C_{DE}$ between the floating gate electrode layer 3 and the semiconductor layer 1. According to the distribution equations shown in FIG. 2, a first voltage $V_{DE}$ applied to the insulating layer 2 decreases as the ratio ($C_{DE}/C_{FE}$) of the insulating layer capacitance $C_{DE}$ to the ferroelectric layer capacitance $C_{FE}$ increases. In addition, a second voltage $V_{FE}$ applied to the ferroelectric layer 4 decreases as the ratio ($C_{FE}/C_{DE}$) of the ferroelectric layer capacitance $C_{FE}$ to the insulating layer capacitance $C_{DE}$ increases. In general a layer capacitance may increase with an increasing surface area of respective upper and lower layers, may decrease with an increasing thickness of the insulating layers, and may increase with increasing dielectric constants of the respective insulating layers.

As described above, the first voltage $V_{DE}$ applied to the insulating layer 2 may be decreased by relatively increasing the insulating layer capacitance $C_{DE}$, and in this case, the endurance of the semiconductor device 200 having an MFMIS structure may be improved.

Figure 3:
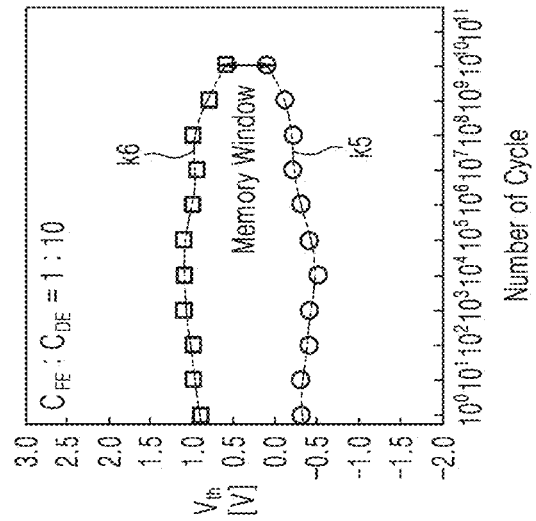
FIGS. 3-5 illustrate graphs showing threshold voltage variations with respect to the number of program-erase cycles performed on a semiconductor device having an MFMIS structure for different ratios of ferroelectric layer capacitance $C_{FE}$ and insulating layer capacitance $C_{DE}$ of the semiconductor device having an MFMIS structure.
Figure 4:
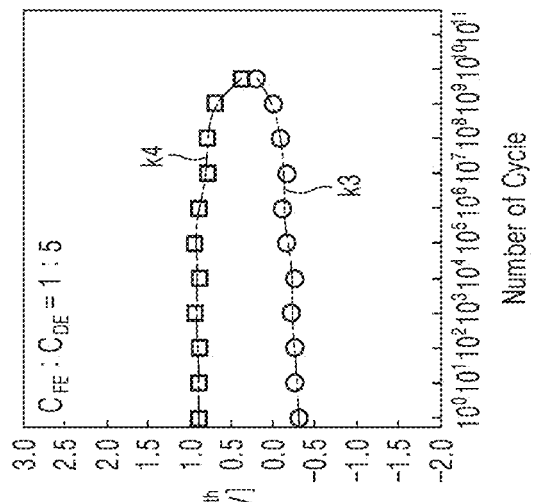
Figure 5:
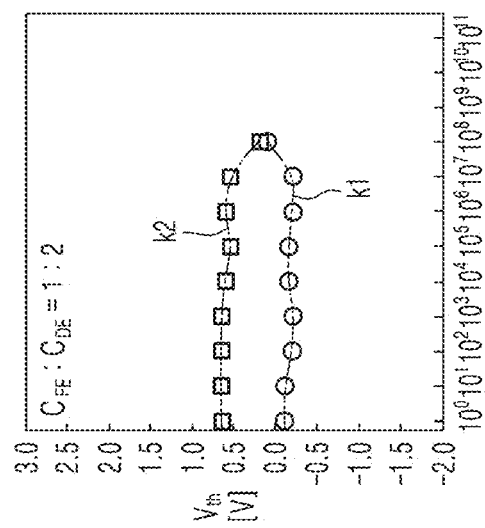

FIGS. 3-5 show threshold voltage variations with respect to the number of program-erase cycles performed on the semiconductor device 200 for different ratios ($C_{FE}$:$C_{DE}$) of the ferroelectric layer capacitance $C_{FE}$ and the insulating layer capacitance $C_{DE}$. In the graphs shown in FIGS. 3-5, the vertical axis refers to a threshold voltage Vth applied to the control gate electrode layer 5, and the horizontal axis refers to the number of program-erase cycles performed on the semiconductor device 200. Herein, the term "number of cycles" or "cycle number" refers to the number of program-erase operations performed on the semiconductor device 200.

In FIG. 3, a first curve k1 shows threshold voltage variations in an erased state, and a second curve k2 shows threshold voltage variations in a programmed state.

Referring FIG. 3, when the ratio ($C_{FE}$:$C_{DE}$) of the ferroelectric layer capacitance $C_{FE}$ and the insulating layer capacitance $C_{DE}$ is 1:2, the first curve k1 and the second curve k2 meet each other at a cycle number of about $10^8$. Accordingly when the number of cycles is about $10^{10}$, the semiconductor device 200 has no memory window.

In FIG. 4, a third curve k3 shows threshold voltage variations in an erased state, and a fourth curve k4 shows threshold voltage variations in a programmed state.

Referring to FIG. 4, when the ratio ($C_{FE}$:$C_{DE}$) of the ferroelectric layer capacitance $C_{FE}$ and the insulating layer capacitance $C_{DE}$ is 1:5, the third curve k3 and the 4 curves k4 meet each other at a cycle number of about $10^{10}$. Accordingly, when the number of cycles is about $10^{10}$, the semiconductor device 200 has no memory window. In addition, the difference between the third curve k3 and the fourth curve k4 is generally greater than the difference between the first curve k1 and the second curve k2. Accordingly the semiconductor device 200 has a larger memory window when the ratio ($C_{FE}$:$C_{DE}$) of the ferroelectric layer capacitance $C_{FE}$ and the insulating layer capacitance $C_{DE}$ is 1:5 than when the ratio ($C_{FE}$:$C_{DE}$) of the ferroelectric layer capacitance $C_{FE}$ and the insulating layer capacitance $C_{DE}$ is 1:2.

In FIG. 5, a fifth curve k5 shows threshold voltage variations in an erased state, and a sixth curve k6 shows threshold voltage variations in a programmed state.

Referring FIG. 5, when the ratio ($C_{FE}$:$C_{DE}$) of the ferroelectric layer capacitance $C_{FE}$ and the insulating layer capacitance $C_{DE}$ is 1:10, the fifth curve k5 and the sixth curve k6 does not meet each other even at a cycle number of about $10^{10}$. Accordingly when the number of cycles is about $10^{10}$, the semiconductor device 200 has a memory window. In addition, the difference between the fifth curve k5 and the sixth curve k6 is generally greater than the difference between the third curve k3 and the fourth curve k4. Accordingly the semiconductor device 200 has a larger memory window when the ratio ($C_{FE}$:$C_{DE}$) of the ferroelectric layer capacitance $C_{FE}$ and the insulating layer capacitance $C_{DE}$ is 1:10 than when the ratio ($C_{FE}$:$C_{DE}$) of the ferroelectric layer capacitance $C_{FE}$ and the insulating layer capacitance $C_{DE}$ is 1:5.

As described above with reference to FIGS. 3-5, as the ratio ($C_{FE}$/$C_{DE}$) of the ferroelectric layer capacitance $C_{FE}$ to the insulating layer capacitance $C_{DE}$ decreases, the memory window of the semiconductor device 200 may increase. Alternatively or additionally, when the ratio ($C_{FE}$/$C_{DE}$) of the ferroelectric layer capacitance $C_{FE}$ to the insulating layer capacitance $C_{DE}$ is $1/10$, the semiconductor device 200 may have a memory window at a cycle number of about $10^{10}$, which may be a suitable cycle number for DRAM devices, and may thus be operated as a memory device. Such a DRAM device may be or may be referred to a a "1T DRAM" device; however, example embodiments are not limited thereto. However, this is a non-limiting example, and the ratio ($C_{FE}$/$C_{DE}$) of the ferroelectric layer capacitance $C_{FE}$ to the insulating layer capacitance $C_{DE}$ which allows the semiconductor device 200 to have a memory window at a cycle number of about $10^{10}$ may be determined to be different from $1/10$ depending on the quality of various components of the semiconductor device 200.

To adjust the ratio ($C_{FE}$/$C_{DE}$) of the ferroelectric layer capacitance $C_{FE}$ to the insulating layer capacitance $C_{DE}$, the area of the insulating layer 2 and the area of the ferroelectric layer 4 may be adjusted while maintaining the ratio of the dielectric constant to the thickness of the insulating layer 2 and the ratio of the dielectric constant to the thickness of the ferroelectric layer 4 to be equal to each other. For example, when the area of the insulating layer 2 is adjusted to be 10 times the area of the ferroelectric layer 4, the ratio ($C_{FE}$/$C_{DE}$) of the ferroelectric layer capacitance $C_{FE}$ to the insulating layer capacitance $C_{DE}$ may be $1/10$.

For example, when the first length l1 and the first width w1 of the insulating layer 2 are respectively 50 nm and 50 nm, and the second length l2 and the second width w2 of the ferroelectric layer 4 are respectively 5 nm and 50 nm, the area of the insulating layer 2 may be 10 times the area of the ferroelectric layer 4. In this case, however, because the second length l2 of the ferroelectric layer 4 is small, that is, 5 nm, process difficulty may increase.

Alternatively or additionally, for example, when the first length l1 and the first width w1 of the insulating layer 2 are respectively 100 nm and 50 nm, and the second length l2 and the second width w2 of the ferroelectric layer 4 are respectively 10 nm and 50 nm, the area of the insulating layer 2 may be 10 times the area of the ferroelectric layer 4. However, in this case, because the first length l1 of the insulating layer 2 is large, that is, 100 nm, the degree of integration of the semiconductor device 200 may be low.

Figure 6:
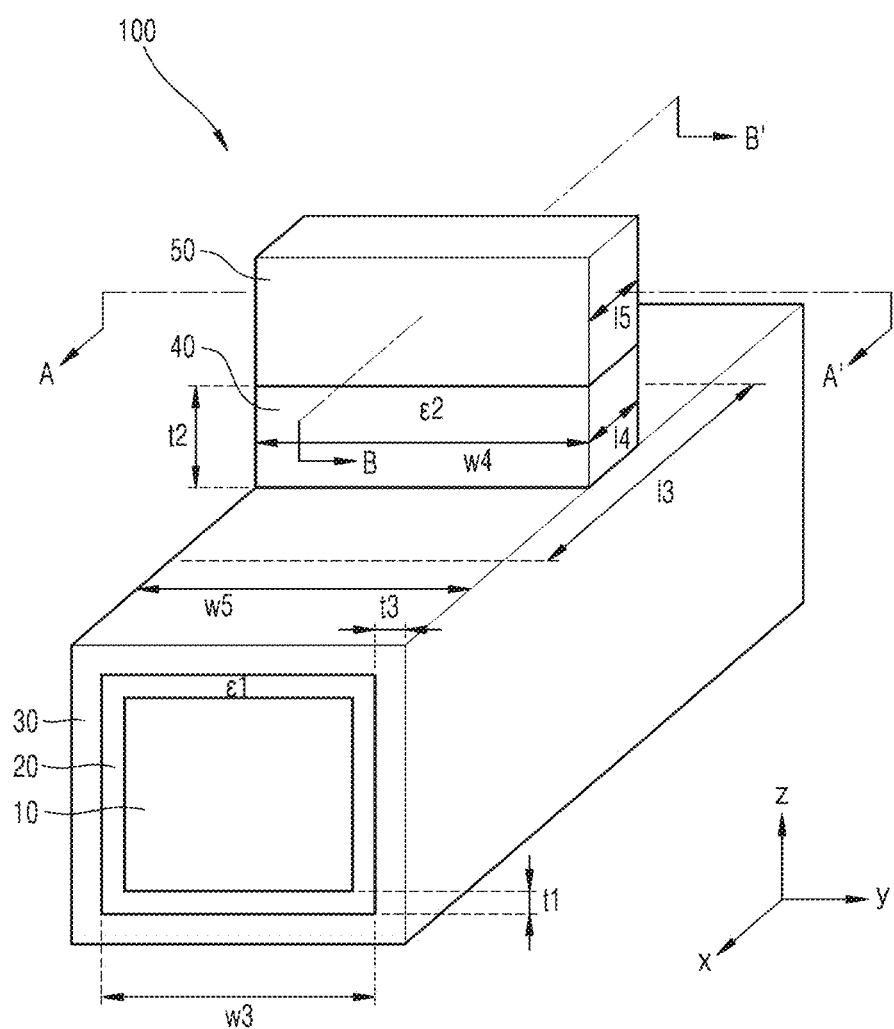
FIG. 6 is a perspective view schematically illustrating an example structure of a semiconductor device according to some example embodiments.
Figure 7:
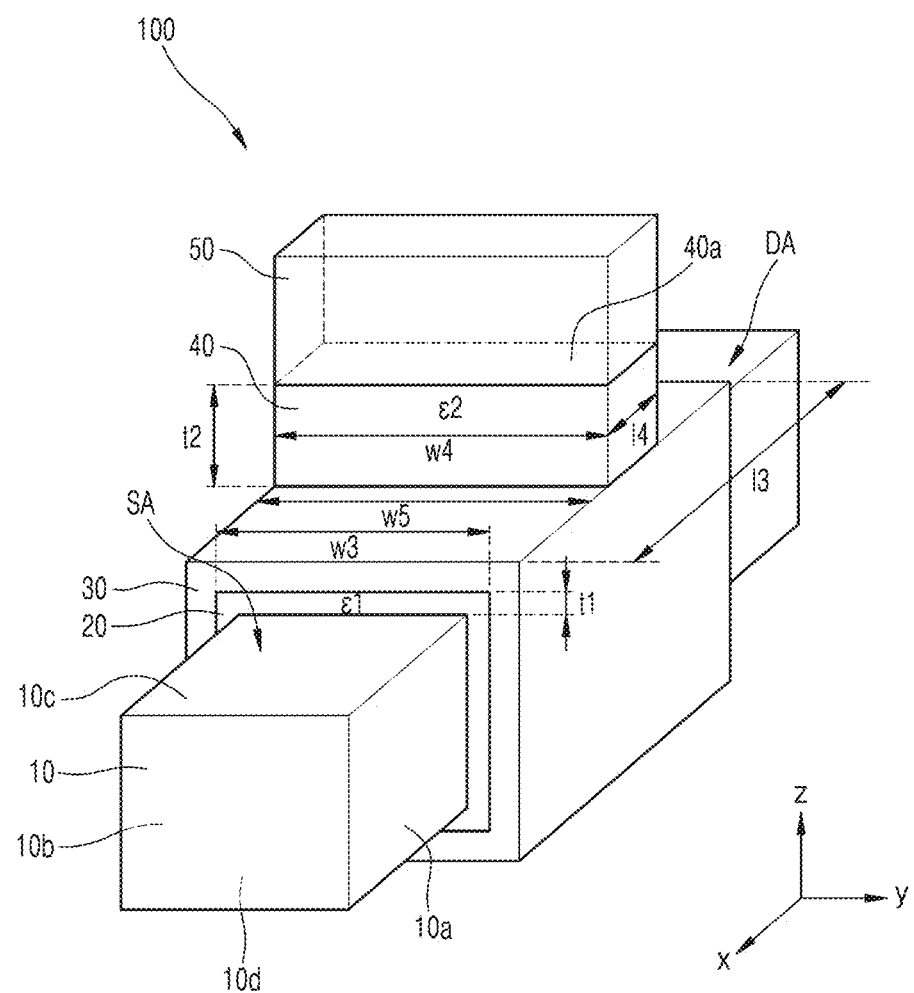
FIG. 7 is a perspective view schematically illustrating an example structure of the semiconductor device shown in FIG. 6.
Figure 8:
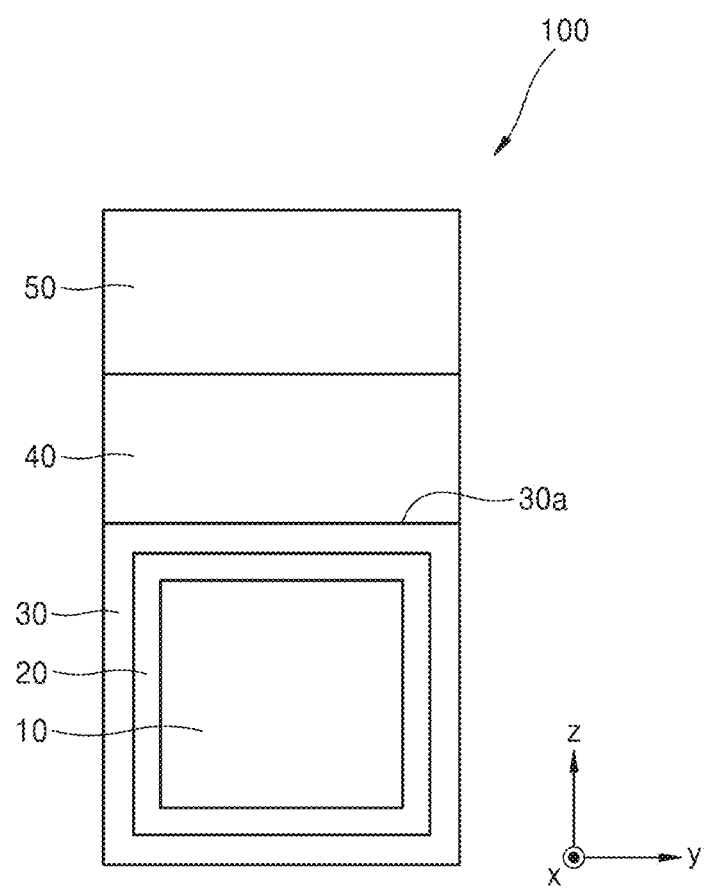
FIG. 8 is a cross-sectional view taken along line A-A' of FIG. 6.
Figure 9:
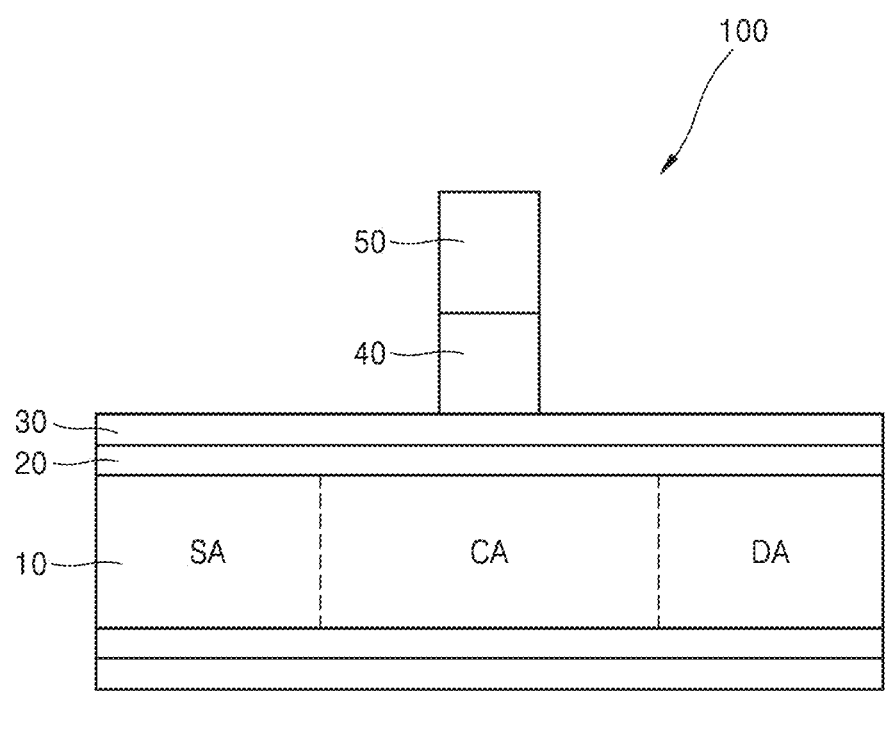
FIG. 9 is a cross-sectional view taken along line B-B' of FIG. 6.
Figure 10:
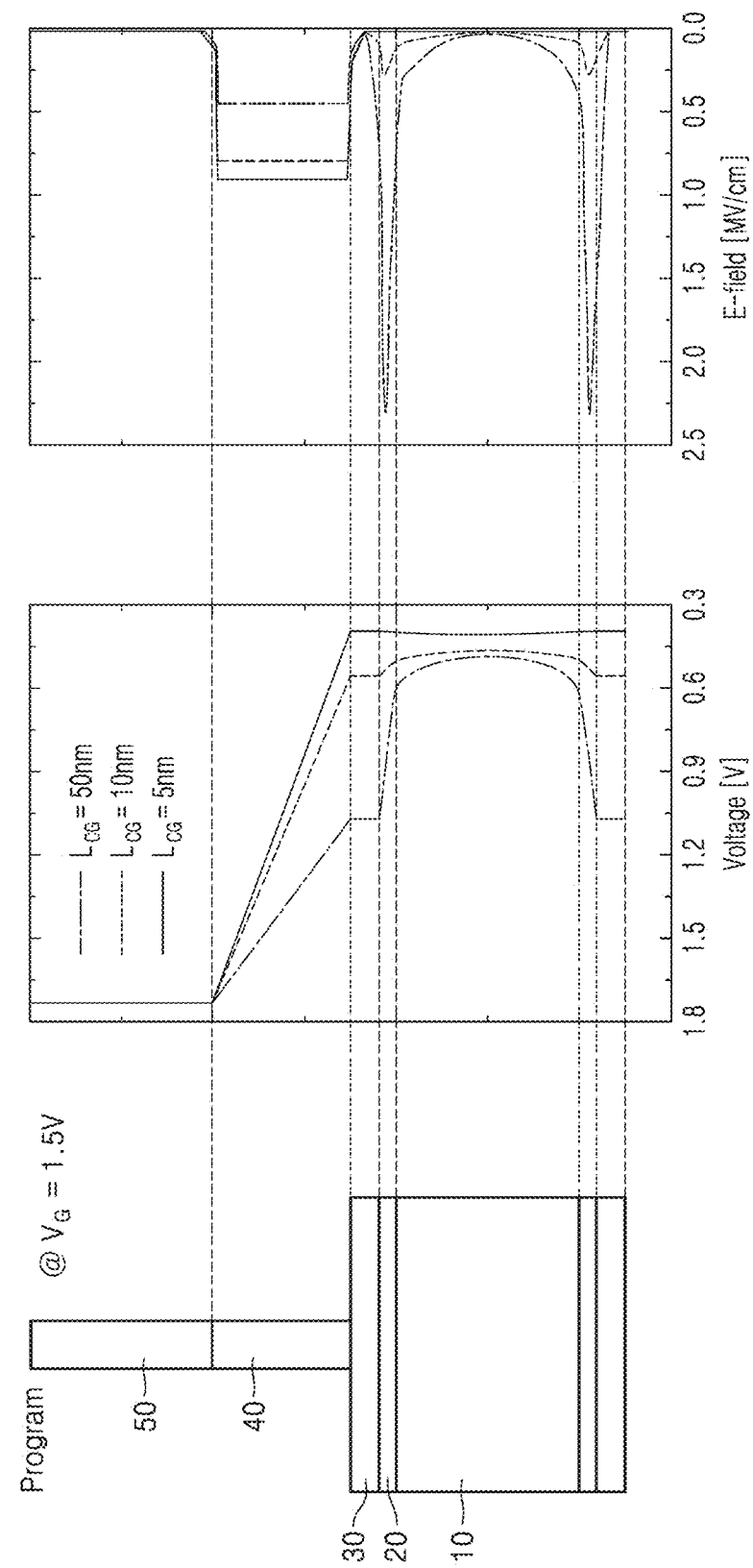
FIG. 10 is a view illustrating distributions of voltage and an electric field in the semiconductor device shown in FIG. 6 for different lengths of a ferroelectric layer of the semiconductor device when the semiconductor device is in a programmed state.
Figure 11:
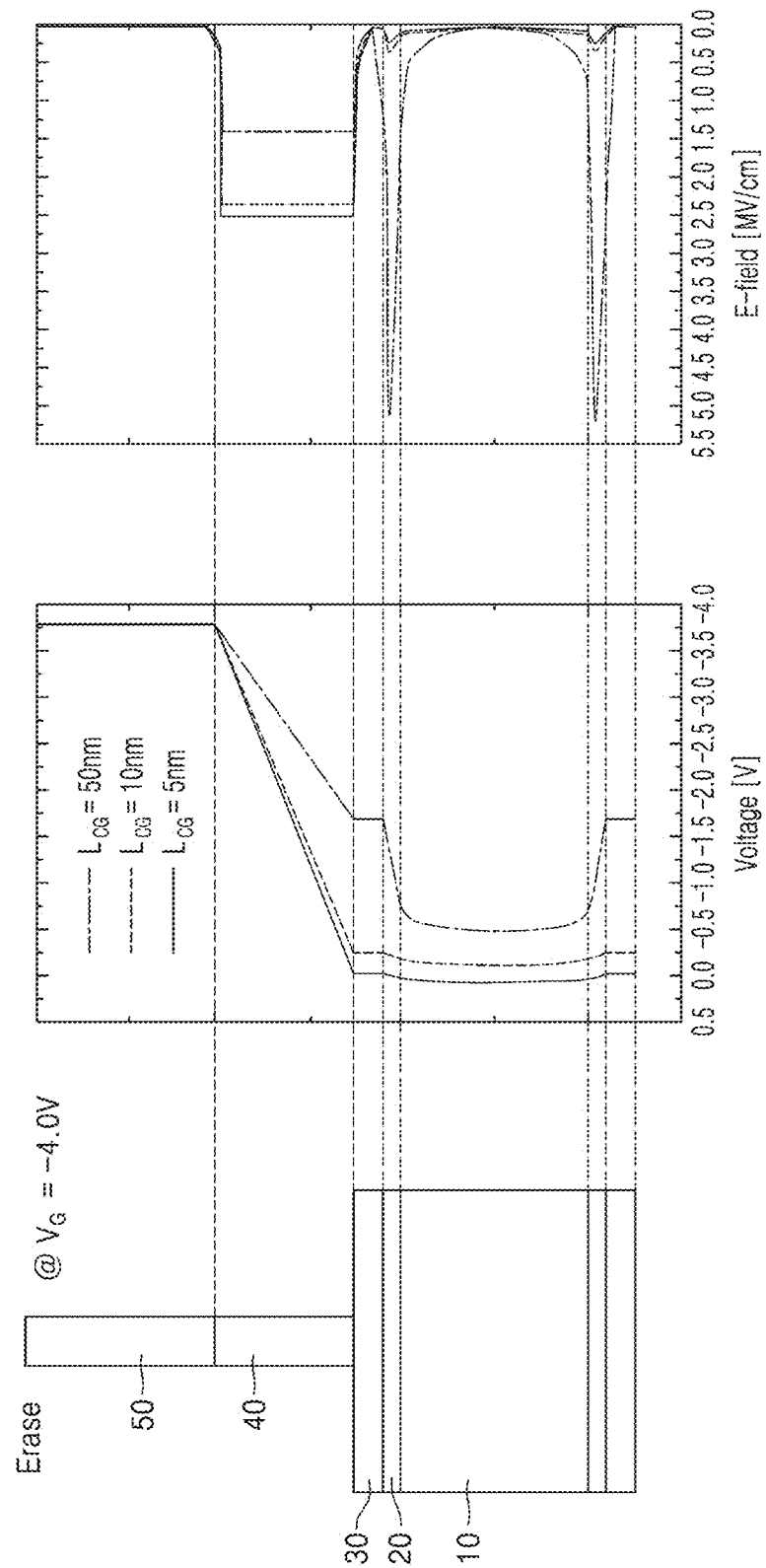
FIG. 11 is a view illustrating distributions of voltage and an electric field in the semiconductor device shown in FIG. 6 for different lengths of the ferroelectric layer of the semiconductor device when the semiconductor device is in an erased state.

FIG. 6 is a perspective view schematically illustrating an example structure of a semiconductor device 100 according to some example embodiments. FIG. 7 is a perspective view schematically illustrating an example structure of the semiconductor device 100 shown in FIG. 6. FIG. 8 is a cross-sectional view taken along line A-A' of FIG. 6; FIG. 9 is a cross-sectional view taken along line B-B' of FIG. 6; FIG. 10 is a view illustrating distributions of voltage and an electric field in the semiconductor device 100 shown in FIG. 6 for different lengths of a ferroelectric layer 40 of the semiconductor device 100 when the semiconductor device 100 is in a programmed state. FIG. 11 is a view illustrating distributions of voltage and an electric field in the semiconductor device 100 shown in FIG. 6 for different lengths of the ferroelectric layer 40 of the semiconductor device 100 when the semiconductor device 100 is in an erased state.

Unlike FIG. 6, FIG. 7 shows the semiconductor device 100 in a state in which portions of an insulating layer 20 and a first gate electrode layer 30, which surround a semiconductor layer 10, are omitted to expose portions of the semiconductor layer 10.

The semiconductor device 100 may have an MFMIS structure. Referring to FIGS. 6 and 7, the semiconductor device 100 may include: the semiconductor layer 10 extending in a first direction x; the insulating layer 20 surrounding the semiconductor layer 10; the first gate electrode layer 30 surrounding the insulating layer 20; the ferroelectric layer 40 provided on the first gate electrode layer 30; and a second gate electrode layer 50 provided on the ferroelectric layer 40.

The semiconductor layer 10 may include silicon (Si), e.g. single-crystal and/or polycrystalline silicon, and may be doped or may be undoped. However, the semiconductor layer 10 is not limited thereto, and may include at least one selected from the group consisting of or including germanium (Ge), SiGe, a Group III-V semiconductor, an oxide semiconductor, a nitride semiconductor, an oxynitride semiconductor, a two-dimensional material, quantum dots, and an organic semiconductor.

Referring to FIG. 9, the semiconductor layer 10 may include a source region SA and a drain region DA, which are apart from each other in the first direction x. A region between the source region SA and the drain region DA of the semiconductor layer 10 may be a channel region CA. The source region SA and the drain region DA may be high-concentration semiconductor regions formed by implanting dopants, such as at least one of boron, phosphorus, or arsenic, into the semiconductor layer 10.

The semiconductor layer 10 may have a columnar shape extending in the first direction x. For example, the semiconductor layer 10 may include: a front surface 10a and a rear surface 10b, which are opposite each other in a second direction y crossing the first direction x; and an upper surface 10c and a lower surface 10d, which are opposite each other in a third direction z perpendicular to both the first direction x and the second direction y. For example, the first direction x and the second direction y may be perpendicular to each other, and the semiconductor layer 10 may have a hexahedral shape.

The insulating layer 20 may have an all-around shape surrounding the semiconductor layer 10. The insulating layer 20 may surround outer peripheral surfaces of the semiconductor layer 10, which has a columnar shape extending in the first direction x. For example, the insulating layer 20 may surround the semiconductor layer 10 and contact the front surface 10a, the rear surface 10b, the upper surface 10c, and the lower surface 10d of the semiconductor layer 10. For example, the insulating layer 20 may have a first length l3 in the first direction x between the source region SA and the drain region DA. In addition, the insulating layer 20 may have a first width w3 in the second direction y. In addition, the insulating layer 20 may have a first thickness t1.

The insulating layer 20 may include a dielectric material having a first dielectric constant ε1 (epsilon 1). For example, the insulating layer 20 may include one selected from the group consisting of or including $Al_2O_3$, $SiO_x$, $AlO_x$, SiON, SiN, and a combination thereof. For example, the insulating layer 20 may include one selected from the group consisting of or including SiO and AlO. In addition, the insulating layer 20 may include: one selected from the group consisting of or including $Al_2O_3$, $SiO_x$, $AlO_x$, SiON, and SiN; and an impurity such as silicon (Si), aluminum (Al), zirconium (Zr), yttrium (Y), lanthanum (La), gadolinium (Gd), strontium (Sr), hafnium (Hf), or cerium (Ce). However, the insulating layer 20 is not limited thereto and may include an impurity other than the above-mentioned impurities. The above-mentioned materials are examples, and the insulating layer 20 may include an insulating dielectric material other than the above-mentioned materials.

The first gate electrode layer 30 may have an all-around shape surrounding the semiconductor layer 10. The first gate electrode layer 30 may surround outer peripheral surfaces of the insulating layer 20, which surrounds side surfaces of the semiconductor layer 10 having a columnar shape extending in the first direction x. Therefore, inner peripheral surfaces of the insulating layer 20 may be in contact with (e.g. contacting/directly contacting) the outer peripheral surfaces of the semiconductor layer 10, and the outer peripheral surfaces of the insulating layer 20 may be in contact with (e.g. contacting/directly contacting) inner peripheral surfaces of the first gate electrode layer 30. The first gate electrode layer 30 may function as a floating gate electrode layer.

The first gate electrode layer 30 include a metallic material such as at least one of molybdenum (Mo), titanium (Ti), tantalum (Ta), tungsten (W), aluminum (Al), copper (Cu), neodymium (Nd), and scandium (Sc). Alternatively or additionally, the first gate electrode layer 30 may include a nitride of the metallic material, an alloy including the metallic material as a main component, or the like. However, the first gate electrode layer 30 is not limited thereto and may include a conductive material other than the above-mentioned metallic materials. The first gate electrode layer 30 may have a single-layer structure or a multilayer structure.

The ferroelectric layer 40 may be provided on the first gate electrode layer 30. The ferroelectric layer 40 may be provided on a portion of outer peripheral surfaces of the first gate electrode layer 30 which surrounds the outer peripheral surfaces of the insulating layer 20. For example, when the semiconductor layer 10 includes the front surface 10a, the rear surface 10b, the upper surface 10c, and the lower surface 10d, the ferroelectric layer 40 may be provided to cover the first gate electrode layer 30 on a side of the upper surface 10c of the semiconductor layer 10. For example, referring to FIG. 8, the ferroelectric layer 40 may be provided on an upper surface 30a of the first gate electrode layer 30, which is oriented in the third direction z. In this case, as shown in FIG. 9, the ferroelectric layer 40 may be provided above the channel region CA between the source region SA and the drain region DA.

For example, the ferroelectric layer 40 may have a second length l4 in the first direction x. For example, the second length l4 of the ferroelectric layer 40 in the first direction x may be about 10 nm to about 20 nm. Alternatively or additionally, the ferroelectric layer 40 may have a second width w4 in the second direction y. Alternatively or additionally, the ferroelectric layer 40 may have a second thickness t2.

Alternatively or additionally, the second length l4 of the ferroelectric layer 40 in the first direction x may be less than the first length l3 of the insulating layer 20 in the first direction x. Alternatively or additionally, the first gate electrode layer 30 may have a third width w5 in the second direction y, and the second width w4 of the ferroelectric layer 40 may be equal to the third width w5 of the first gate electrode layer 30.

The ferroelectric layer 40 may include a material, which has ferroelectricity and a second dielectric constant ε2 (epsilon 2). The ferroelectric layer 40 may include an $HfO_2$-based dielectric material, and may or may not include the respective materials described above with respect the insulating layer 20. A $HfO_2$-based dielectric thin film may have ferroelectricity according to the crystalline phase thereof. The ferroelectric layer 40 may include a material in which an impurity is added to an $HfO_2$-based dielectric material. Examples of the impurity may include at least one of silicon (Si), aluminum (Al), zirconium (Zr), yttrium (Y), lanthanum (La), gadolinium (Gd), strontium (Sr), hafnium (Hf), and cerium (Ce). However, the ferroelectric layer 40 is not limited thereto and may include an impurity other than the above-mentioned impurities.

The ferroelectric layer 40 may include, for example, $Hf_xZr_{(1-x)}O$ (0<x<1). However, the ferroelectric layer 40 is not limited thereto and may include at least one selected from the group consisting of or including HfO, ZrO, SiO, AlO, CeO, YO, LaO, and a perovskite compound. In addition, the ferroelectric layer 40 may include: at least one selected from the group consisting of or including HfO, ZrO, SiO, AlO, CeO, YO, LaO, and a perovskite compound; and an impurity such as silicon (Si), aluminum (Al), zirconium (Zr), yttrium (Y), lanthanum (La), gadolinium (Gd), strontium (Sr), hafnium (Hf), or cerium (Ce). However, the ferroelectric layer 40 is not limited thereto and may include an impurity other than the above-mentioned impurities.

The ferroelectricity of the ferroelectric layer 40 varies depending on the crystalline phase/the detailed crystalline phase of a material (e.g. of grains of crystalline material) included in the ferroelectric layer 40. The reason may be that a material chemically included in the ferroelectric layer 40 may affect the crystal structure of the ferroelectric layer 40. Therefore, the characteristics of the ferroelectric layer 40 may be finely controlled by adjusting the type and content of an impurity added to the ferroelectric layer 40. The ferroelectric layer 40 may be formed through an atomic layer deposition (ALD) process; however, example embodiments are not limited thereto.

The second gate electrode layer 50 may be provided on the ferroelectric layer 40. The second gate electrode layer 50 may function as a control gate electrode layer. A third length l5 of the second gate electrode layer 50 in the first direction x may be equal to the second length l4 of the ferroelectric layer 40 in the first direction x. In addition, the width of the second gate electrode layer 50 in the second direction y may be equal to the second width w4 of the ferroelectric layer 40 in the second direction y.

The second gate electrode layer 50 may include a metallic material such as molybdenum (Mo), titanium (Ti), tantalum (Ta), tungsten (W), aluminum (Al), copper (Cu), neodymium (Nd), or scandium (Sc). In addition, the second gate electrode layer 50 may include a nitride of the metallic material, an alloy including the metallic material as a main component, or the like. However, the second gate electrode layer 50 is not limited thereto and may include a conductive material other than the above-mentioned metallic materials. The second gate electrode layer 50 may have a single-layer structure or a multilayer structure.

A gate voltage $V_{GS}$ may be applied to the second gate electrode layer 50, which functions as a control gate electrode layer in the semiconductor device 100. As described above with reference to FIG. 2, the gate voltage $V_{GS}$ may be differently distributed to the ferroelectric layer 40 and the insulating layer 20 according to the ratio of first capacitance C1 between the semiconductor layer 10 and the first gate electrode layer 30 and between the source region SA and the drain region DA, For example, insulating layer capacitance $C_{DE}$, and second capacitance C2 between the first gate electrode layer 30 and the second gate electrode layer 50 and between the source region SA and the drain region DA, that is, ferroelectric layer capacitance $C_{FE}$.

Alternatively or additionally, the ratio (C2/C1) of the second capacitance C2 to the first capacitance C1 of the semiconductor device 100 may be about ¹⁄₂₀ to about ⅕. In this case, the magnitude of voltage distributed to the insulating layer 20 may be relatively low, and thus, the endurance of the semiconductor device 100 may increase.

The first capacitance C1 and the second capacitance C2 may be controlled by adjusting factors such as one or more or all of the thicknesses, dielectric constants, and areas of the insulating layer 20 and the ferroelectric layer 40. In particular, the ratio of the first capacitance C1 and the second capacitance C2 may be adjusted by adjusting only the area of the insulating layer 20 and the area of the ferroelectric layer 40 while maintaining the ratio of dielectric constant to thickness of the insulating layer 20 to be equal to the ratio of dielectric constant to thickness of the ferroelectric layer 40.

For example, a first ratio (r1=ε1/t1), which is the ratio of the first dielectric constant ε1 of the insulating layer 20 to the first thickness t1 of the insulating layer 20, may be equal to a second ratio (r2=ε2/t2), which is the ratio of the second dielectric constant ε2 of the ferroelectric layer 40 to the second thickness t2 of the ferroelectric layer 40.

Alternatively or additionally, the total area of surfaces of the insulating layer 20, which are in contact with the first gate electrode layer 30 between the source region SA and the drain region DA, may be referred to as a first area A1. For example, the total area of outer peripheral surfaces of the insulating layer 20, which are in contact with the inner peripheral surfaces of the first gate electrode layer 30 between the source region SA and the drain region DA, may be referred to as the first area A1. The area of a surface of the ferroelectric layer 40, which is in contact with the first gate electrode layer 30 between the source region SA and the drain region DA, may be referred to as a second area A2. In this case, the ratio (A2/A1) of the second area A2 to the first area A1 of the semiconductor device 100 may be about ¹⁄₂₀ to about ⅕.

As described above, when the first ratio (r1=ε1/t1) and the second ratio (r2=ε2/t2) are equal to each other, and the ratio (A2/A1) of the second area A2 to the first area A1 is about ¹⁄₂₀ to about ⅕, the ratio (C2/C1) of the second capacitance C2 to the first capacitance C1 may be about ¹⁄₂₀ to about ⅕.

For example, the first length l3 and the first width w3 of the insulating layer 20 between the source region SA and the drain region DA may be 50 nm and 50 nm, respectively. In this case, the first area A1 is 10,000 nm² (50 nm×50 nm×4). In addition, the second length l4 and the second width w4 of the ferroelectric layer 40 may be 10 nm and 50 nm, respectively. In this case, the second area A2 is 500 nm² (10 nm×50 nm). Therefore, the ratio (A2/A1) of the second area A2 to the first area A1 of the semiconductor device 100 is ¹⁄₂₀.

As described above, even when the first length l3 of the insulating layer 20 between the source region SA and the drain region DA is 50 nm, and the second length l4 of the ferroelectric layer 40 is 10 nm, the ratio (A2/A1) of the second area A2 to the first area A1 may be adjusted to be ¹⁄₂₀. In other words, even when the first length l3 of the insulating layer 20 between the source region SA and the drain region DA is 50 nm, and the second length l4 of the ferroelectric layer 40 is 10 nm, the ratio (C2/C1) of the second capacitance C2 to the first capacitance C1 of the semiconductor device 100 may be adjusted to be ¹⁄₂₀. Therefore, the semiconductor device 100 may be configured to have a high degree of integration and an endurance of about $10^{10}$ cycles or more without significantly increasing the difficulty of manufacturing processes.

Referring to FIG. 10, when a voltage of 1.5 V is applied to the second gate electrode layer 50, the semiconductor device 100 may be in a programmed state. As described above with reference to FIGS. 6 and 7, the second gate electrode layer 50 and the ferroelectric layer 40 may have the same length in the second direction y. As the length $L_{CG}$ of the ferroelectric layer 40 and the second gate electrode layer 50 in the second direction y decreases, the magnitude of voltage distributed to the insulating layer 20 may decrease. As shown in the graph of FIG. 10, as the length $L_{CG}$ of the second gate electrode layer 50 in the second direction y decreases to 50 nm, 10 nm, and 5 nm, the magnitude of voltage distributed to the insulating layer 20 decreases.

Referring to FIG. 11, when a voltage of −4.0 V is applied to the second gate electrode layer 50, the semiconductor device 100 may be in an erased state. As described above with reference to FIGS. 6 and 7, the second gate electrode layer 50 and the ferroelectric layer 40 may have the same length in the second direction y. As the length $L_{CG}$ of the ferroelectric layer 40 and the second gate electrode layer 50 in the second direction y decreases, the magnitude of voltage distributed to the insulating layer 20 may decrease. As shown in the graph of FIG. 10, as the length $L_{CG}$ of the second gate electrode layer 50 in the second direction y decreases to 50 nm, 10 nm, or 5 nm, the magnitude of voltage distributed to the insulating layer 20 decreases.

Figure 12:
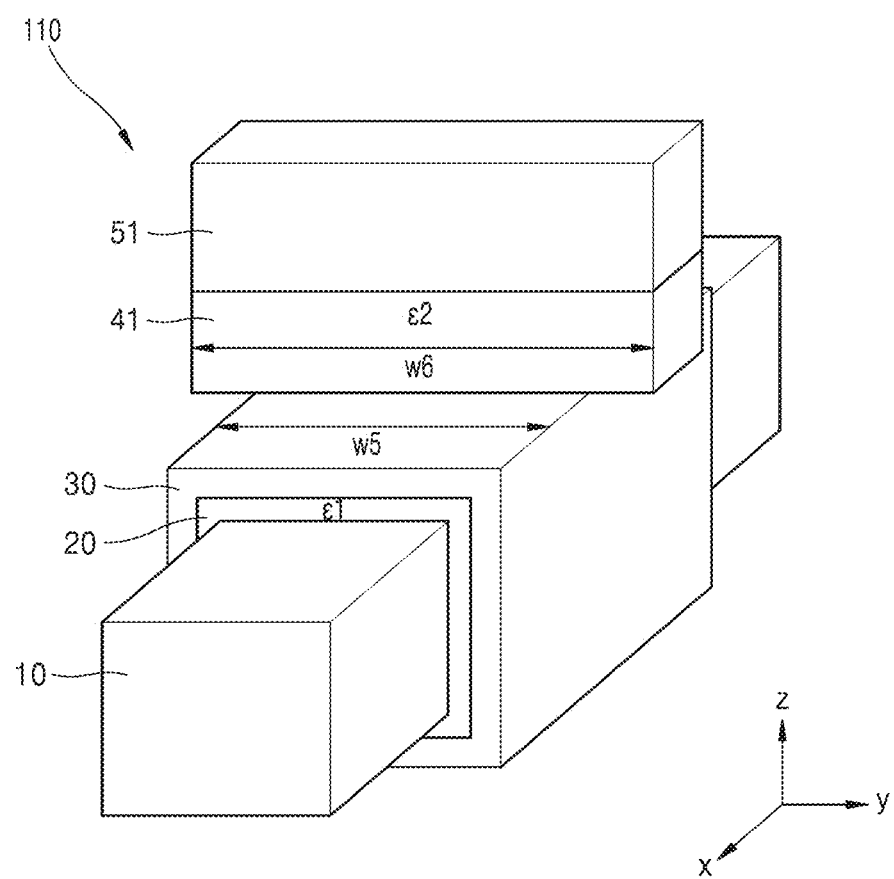
FIG. 12 is a perspective view schematically illustrating an example structure of a semiconductor device according to another example embodiment.

FIG. 12 is a perspective view schematically illustrating an example structure of a semiconductor device 110 according to another embodiment.

The semiconductor device 110 shown in FIG. 12 may be substantially the same as the semiconductor device 100 shown in FIG. 6 except that the width of a ferroelectric layer 41 and the width of a second gate electrode layer 51 in a second direction y is greater than a third width w5 of a first gate electrode layer 30 in the second direction y. In the following description of FIG. 12, the same elements as those described with reference to FIGS. 6 to 11 will not be described again.

The semiconductor device 110 may have an MFMIS structure. Referring to FIG. 10, the semiconductor device 110 may include: a semiconductor layer 10 extending in a first direction x; an insulating layer 20 surrounding the semiconductor layer 10; the first gate electrode layer 30 surrounding the insulating layer 20; the ferroelectric layer 41 provided on the first gate electrode layer 30; and the second gate electrode layer 51 provided on the ferroelectric layer 41.

A second width w6 of the ferroelectric layer 41 in the second direction y may be greater than the third width w5 of the first gate electrode layer 30 in the second direction y. Therefore, the ferroelectric layer 41 may protrude in the second direction y from the first gate electrode layer 30. The width of the second gate electrode layer 51 in the second direction y may be equal to the second width w6 of the ferroelectric layer 41 in the second direction y.

Figure 13:
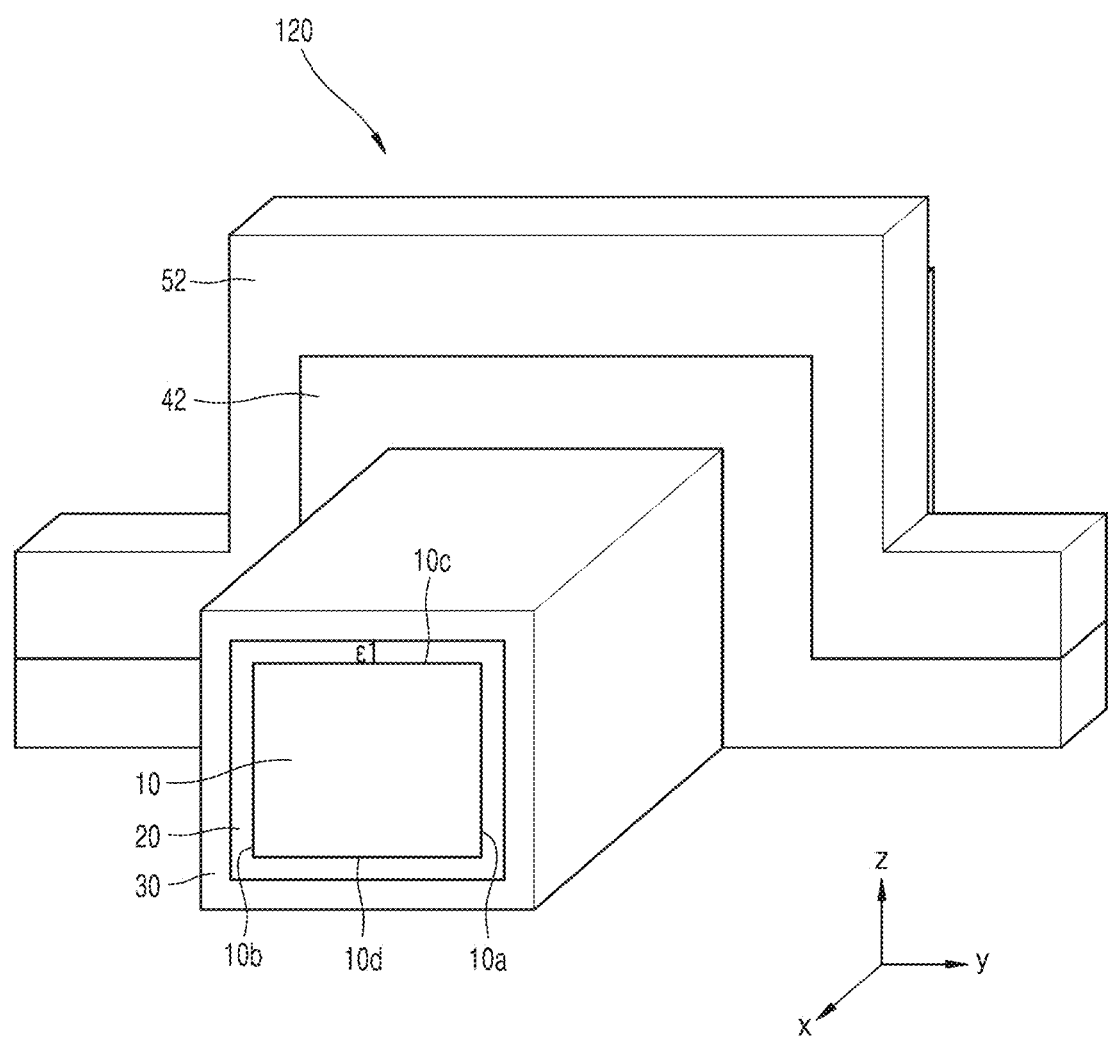
FIG. 13 is a perspective view schematically illustrating an example structure of a semiconductor device according to another embodiment.
Figure 14:
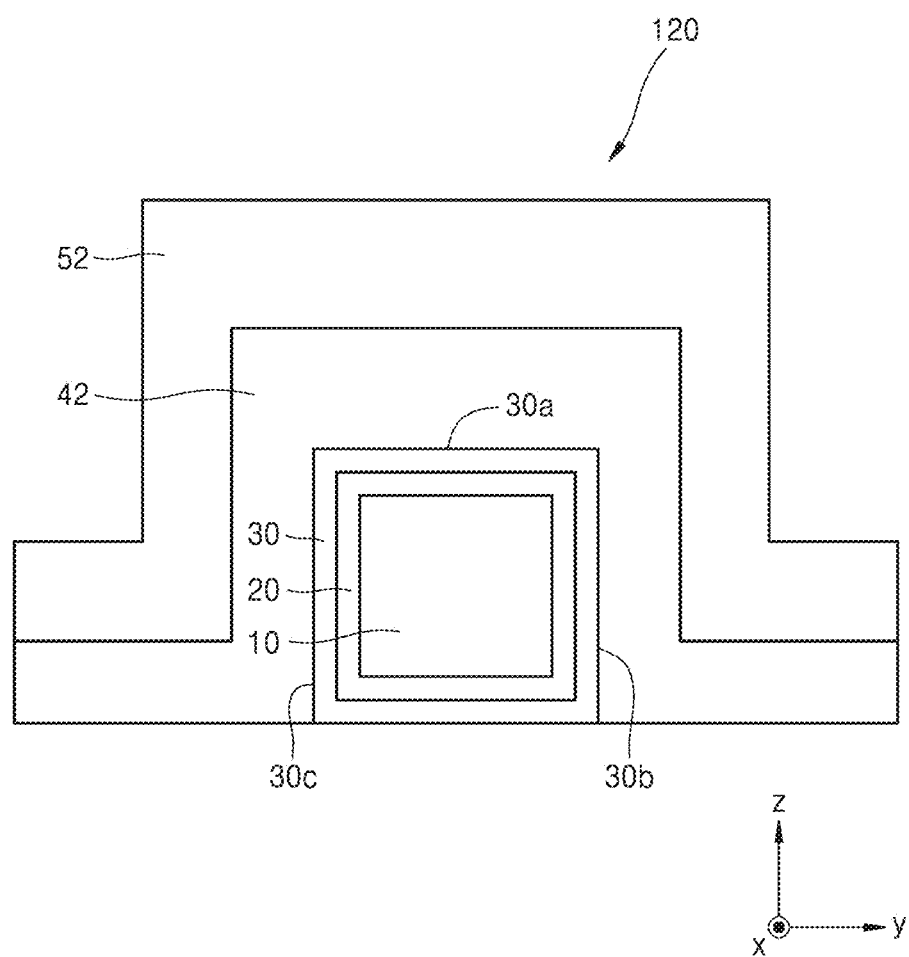
FIG. 14 is a side cross-sectional view schematically illustrating an example structure of the semiconductor device shown in FIG. 13.

FIG. 13 is a perspective view schematically illustrating an example structure of a semiconductor device 120 according to another embodiment. FIG. 14 is a side cross-sectional view schematically illustrating an example structure of the semiconductor device 120 shown in FIG. 13.

The semiconductor device 120 shown in FIGS. 13 and 14 may be substantially the same as the semiconductor device 100 shown in FIG. 4 except that a ferroelectric layer 42 and a second gate electrode layer 52 cover a front surface 30b and a rear surface 30c of a first gate electrode layer 30 as well as an upper surface 30a of the first gate electrode layer 30. In the following descriptions of FIGS. 13 and 14, the same elements as those described with reference to FIGS. 6 to 11 will not be described again.

The semiconductor device 120 may include an MFMIS structure. Referring to FIGS. 13 and 14, the semiconductor device 120 may include: a semiconductor layer 10 extending in a first direction x; an insulating layer 20 surrounding the semiconductor layer 10; the first gate electrode layer 30 surrounding the insulating layer 20; the ferroelectric layer 42 provided on the first gate electrode layer 30; and the second gate electrode layer 52 provided on the ferroelectric layer 42.

The semiconductor layer 10 may have a columnar shape extending in the first direction x. The insulating layer 20 and the first gate electrode layer 30 may surround outer peripheral surfaces of the semiconductor layer 10.

For example, the semiconductor layer 10 may include: a front surface 10a and a rear surface 10b, which are opposite each other in a second direction y; and an upper surface 10c and a lower surface 10d, which are opposite each other in a third direction z The ferroelectric layer 42 and the second gate electrode layer 52 may extend to cover the first gate electrode layer 30 on the side of the front surface 10a and the side of the rear surface 10b.

For example, the first gate electrode layer 30 may include the front surface 30b, the rear surface 30c, and the upper surface 30a, which respectively face the front surface 10a, the rear surface 10b, and the upper surface 10c of the semiconductor layer 10. In this case, the ferroelectric layer 42 and the second gate electrode layer 52 may extend to surround all the front surface 30b, the rear surface 30c, and the upper surface 30a of the first gate electrode layer 30.

Figure 15:
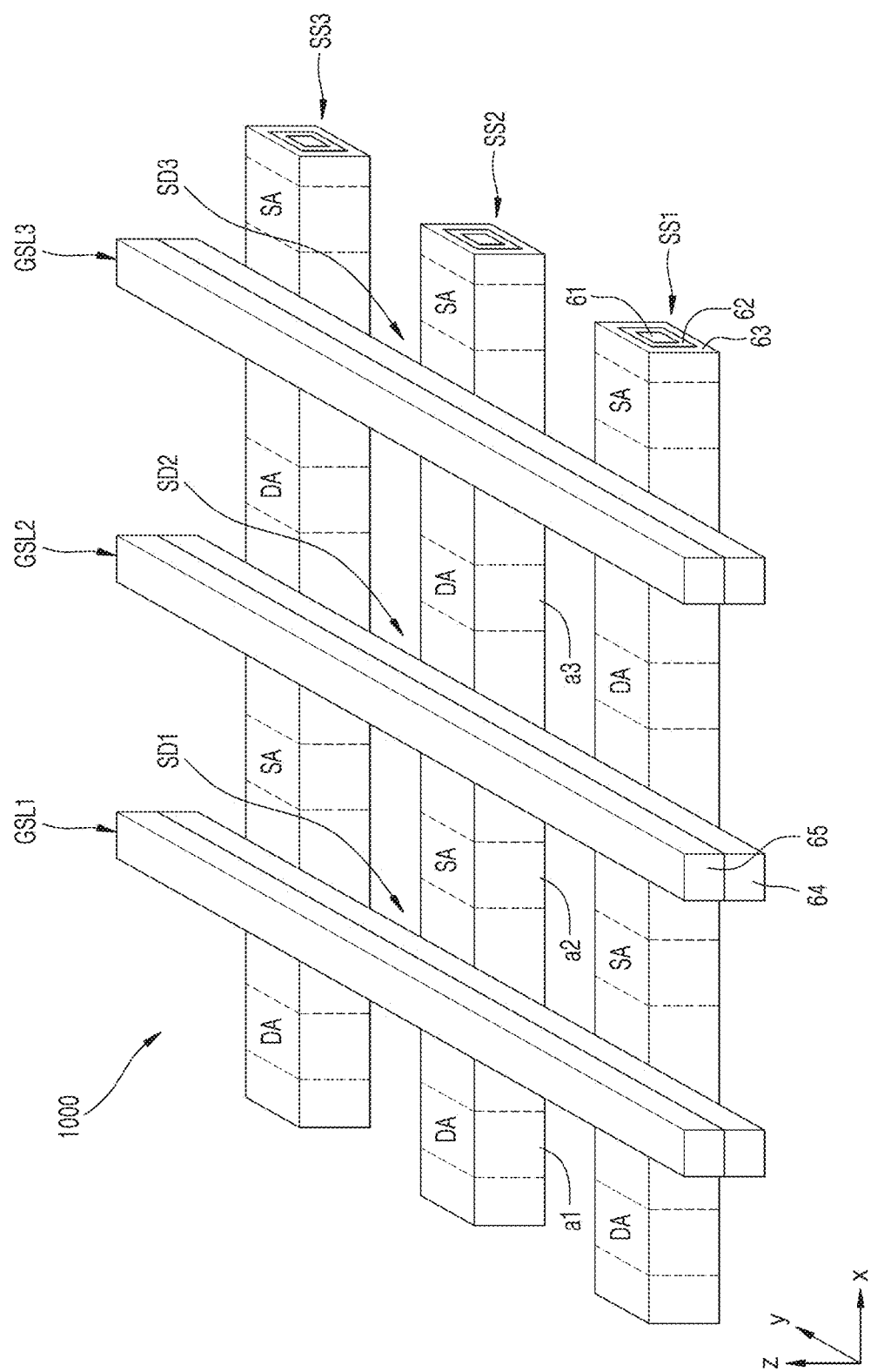
FIG. 15 is a perspective view schematically illustrating an example configuration of a semiconductor device array structure according to some example embodiments.

FIG. 15 is a perspective view schematically illustrating an example configuration of a semiconductor device array structure 1000 according to some example embodiments.

Referring to FIG. 15, the semiconductor device array structure 1000 may include: a plurality of gate lines 65 provided side by side in a first direction x and each extending in a second direction y; a plurality of semiconductor structures SS1, SS2, and SS3 provided side by side in the second direction y and crossing the gate lines 65, each of the semiconductor structures SS1, SS2, and SS3 extending in the first direction x; and a plurality of ferroelectric structures 64 provided between the gate lines 65 and the semiconductor structures SS1, SS2, and SS3.

Each of the semiconductor structures SS1, SS2, and SS3 may include: a semiconductor layer 61 extending in the first direction x and including a plurality of source regions SA and a plurality of drain regions DA, which are apart from each other in the first direction x; an insulating layer 62 surrounding the semiconductor layer 61; and a first gate electrode layer 63 surrounding the insulating layer 62. The semiconductor layer 61, the insulating layer 62, and the first gate electrode layer 63 are substantially the same as the semiconductor layer 10, the insulating layer 20, and the first gate electrode layer 30 shown in FIG. 6, and thus descriptions thereof will not be presented here.

The ferroelectric structures 64 may be provided side by side in the first direction x, and each of the ferroelectric structures 64 may extend in the second direction y. In this case, the gate lines 65 and the ferroelectric structures 64 may be formed in the same pattern and may form a plurality of gate stack lines GSL1, GSL2, and GSL3.

Each of the gate stack lines GSL1, GSL2, and GSL3 may pass between source regions SA and drain regions DA, which are adjacent to each other in the semiconductor structures SS1, SS2, and SS3.

For example, a first gate stack line GSL1 may pass between a first drain region a1 and a first source region a2 of a second semiconductor structure SS2. In addition, a second gate stack line GSL2 may pass between the first source region a2 and a second drain region a3 of the second semiconductor structure SS2.

The semiconductor device array structure 1000 may include a plurality of semiconductor devices including a first semiconductor device SD1, a second semiconductor device SD2, and a third semiconductor device SD3. The semiconductor devices may include any one selected from the group consisting of or including the semiconductor devices 100, 110, and 120 described with reference to FIGS. 6 to 14.

Between the first drain region a1 and the first source region a2 which are adjacent to each other among the source regions SA and the drain regions DA, the ratio (C2/C1) of second capacitance C2 between a first gate electrode layer 63 and one of the gate lines 65 adjacent thereto to first capacitance C1 between a semiconductor layer 61 and the first gate electrode layer 63 may be about 1/20 to about 1/5.

Two adjacent semiconductor devices among the semiconductor devices may share a source region SA. For example, the first semiconductor device SD1 and the second semiconductor device SD2 may share the first source region a2. Among a plurality of source lines (not shown) and a plurality of bit lines (not shown) which are respectively connected to the source regions SA and the drain regions DA, a bit line connected to the first drain region a1 and a source line connected to the first source region a2 may be turned on, and a bit line connected to the second drain region a3 may be turned off. In this case, among the first semiconductor device SD1 and the second semiconductor device SD2 which are adjacent to each other, only the first semiconductor device SD1 may be selectively operated. As described above, because two adjacent semiconductor devices share one source region SA, the degree of integration of the semiconductor device array structure 1000 may increase.

Figure 16:
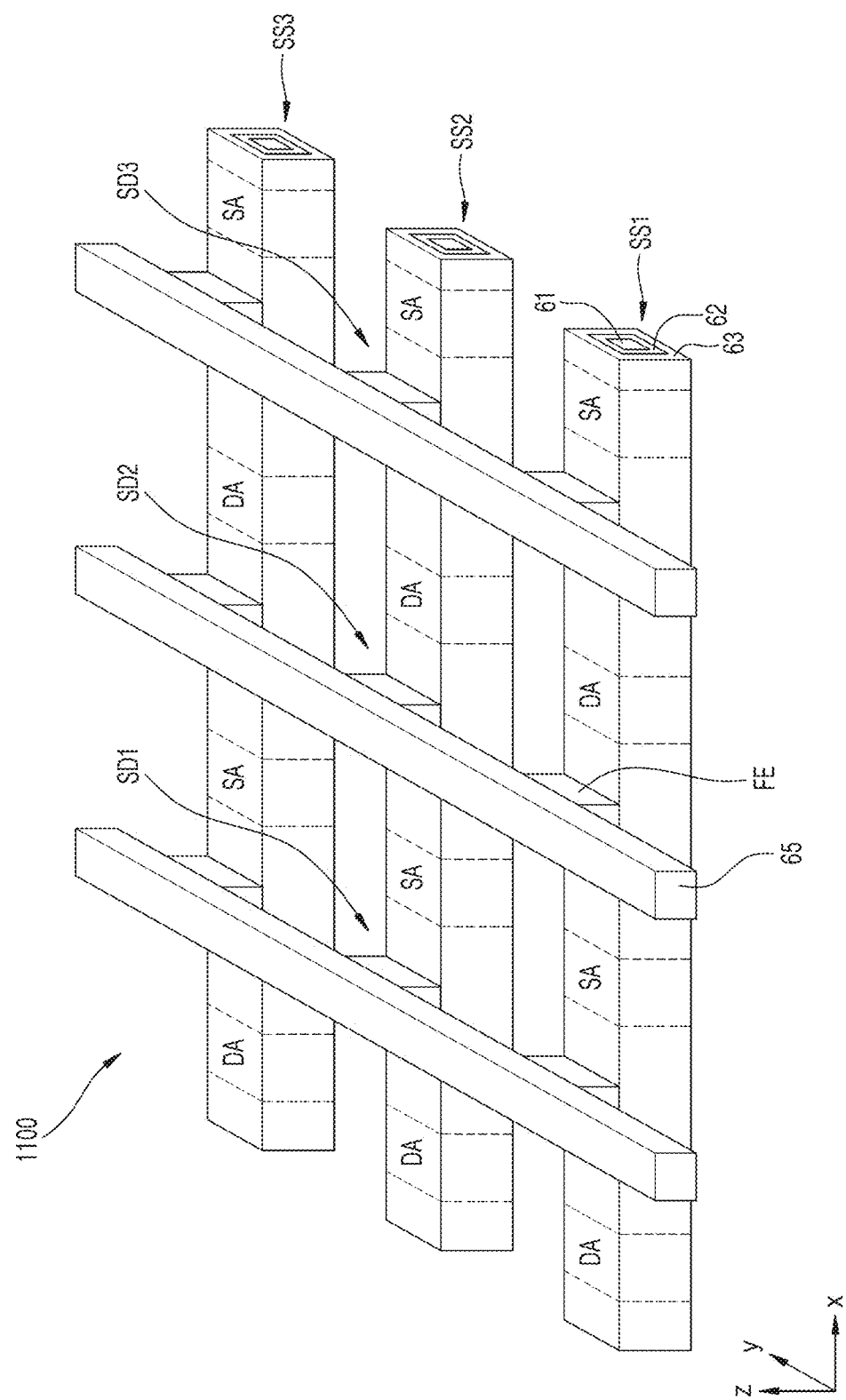
FIG. 16 is a perspective view schematically illustrating an example configuration of a semiconductor device array structure according to another embodiment.

FIG. 16 is a perspective view schematically illustrating an example configuration of a semiconductor device array structure 1100 according to another embodiment.

The semiconductor device array structure 1100 shown in FIG. 16 may be substantially the same as the semiconductor device array structure 1000 shown in FIG. 15 except that a plurality of ferroelectric structures FE are provided in the form of islands. In the following description of FIG. 16, the same elements as those described with reference to FIG. 15 will not be described again.

Referring to FIG. 16, the semiconductor device array structure 1100 may include: a plurality of gate lines 65 provided side by side in a first direction x and each extending in a second direction y; a plurality of semiconductor structures SS1, SS2, and SS3 provided side by side in the second direction y and crossing the gate lines 65, each of the semiconductor structures SS1, SS2, and SS3 extending in the first direction x; and the ferroelectric structures FE provided between the gate lines 65 and the semiconductor structures SS1, SS2, and SS3.

The ferroelectric structures FE may be apart from each other and provided at a plurality of crossing points between the gate lines 65 and the semiconductor structures SS1, SS2, and SS3. For example, nine ferroelectric structures FE may be provided at nine crossing points between three gate lines 65 and three semiconductor structures SS1, SS2, and SS3. As described above, the ferroelectric structures FE of the semiconductor device array structure 1100 may be of an island type.

Figure 17:
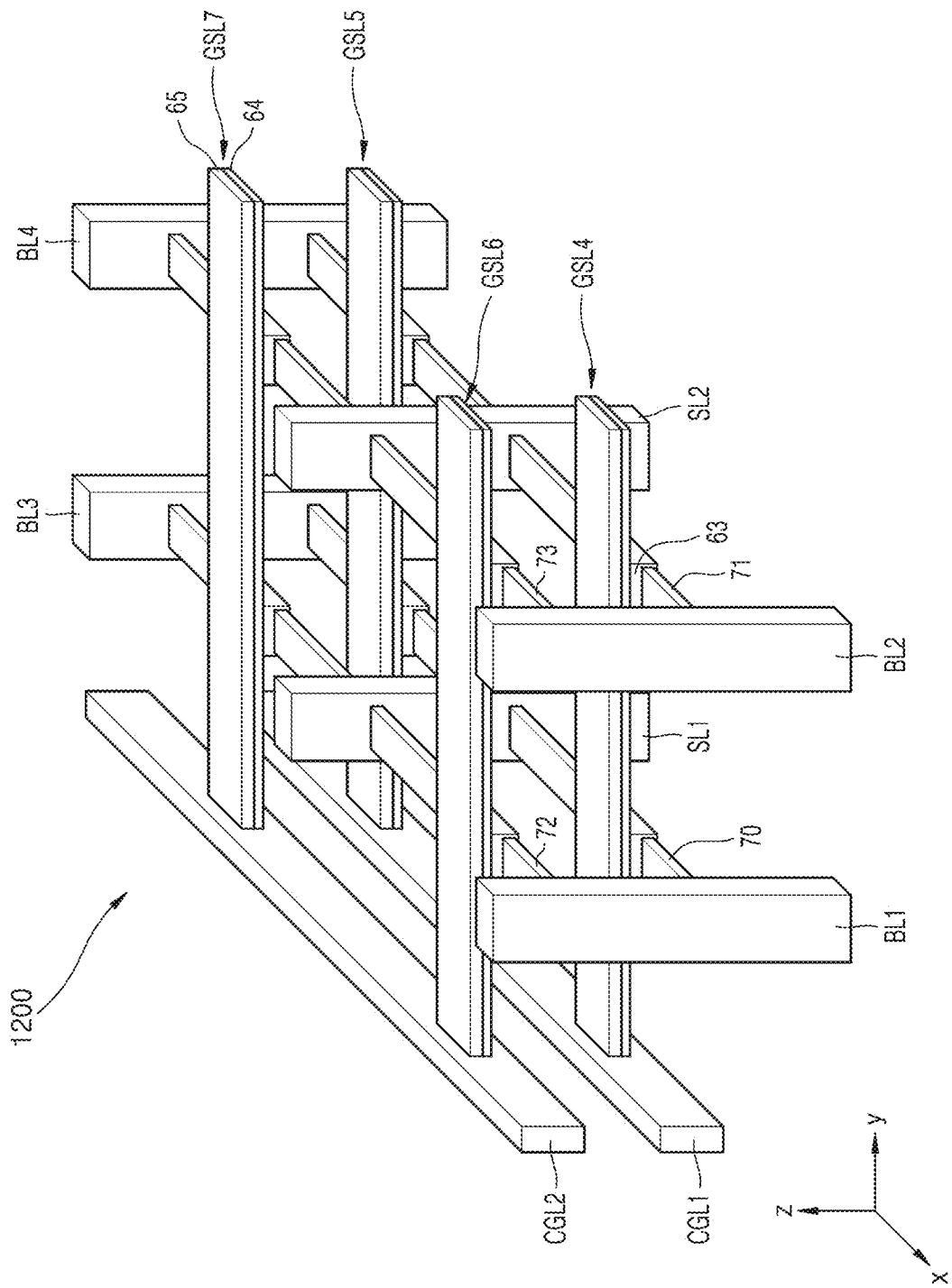
FIG. 17 is a perspective view schematically illustrating an example configuration of a semiconductor device array structure according to another embodiment.

FIG. 17 is a perspective view schematically illustrating an example configuration of a semiconductor device array structure 1200 according to another embodiment.

Referring to FIG. 17, the semiconductor device array structure 1200 may have a three-dimensional structure. For example, the semiconductor device array structure 1200 shown in FIG. 17 may be formed by stacking, in a third direction z, such semiconductor device array structures as the semiconductor device array structure 1000 shown in FIG. 15. However, this is a non-limiting example, and semiconductor device array structures such as the semiconductor device array structure 1100 shown in FIG. 16 may be stacked in the third direction z to form a three-dimensional structure.

The semiconductor device array structure 1200 may include: a plurality of gate lines 65 arranged side by side in a first direction x in a first layer and each extending in a second direction y; a plurality of semiconductor structures 70 and 71 arranged side by side in the second direction y and crossing the gate lines 65, each of the semiconductor structures 70 and 71 extending in the first direction x; and a plurality of ferroelectric structures 64 provided between the gate lines 65 and the semiconductor structures 70 and 71. In addition, the semiconductor device array structure 1200 may include: a plurality of gate lines 65 provided in a second layer above the first layer and arranged side by side in the first direction x, each of the gate lines 65 extending in the second direction y; a plurality of semiconductor structures 72 and 73 arranged side by side in the second direction y and crossing the gate lines 65, each of the semiconductor structures 72 and 73 extending in the first direction x; and a plurality of ferroelectric structures 64 provided between the gate lines 65 and the semiconductor structures 72 and 73.

The semiconductor structures 70, 71, 72, and 73 may be substantially the same as the semiconductor structures SS1, SS2, and SS3 shown in FIG. 15. However, in FIG. 17, the insulating layers 62 and portions of the first gate electrode layers 63 are omitted for clarity of illustration.

The semiconductor device array structure 1200 may include a plurality of common gate lines CGL1 and CGL2, which are connected to gate stack lines GSL4, GSL5, GSL6, and GSL7 formed by the gate lines 65 and the ferroelectric structures 64. For example, a first gate stack line GSL4 and a second gate stack line GSL5, which are provided in the first layer, may be connected to a first common gate line CGL1 extending in the first direction x. In addition, a third gate stack line GSL6 and a fourth gate stack line GSL7, which are provided in the second layer, may be connected to a second common gate line CGL2 extending in the first direction x.

The semiconductor device array structure 1200 may include a plurality of bit lines BL1, BL2, BL3, and BL4 and a plurality of source lines SL1 and SL2, which extend in the third direction z and passing through a plurality of source regions and a plurality of drain regions of the semiconductor structures 70, 71, 72, and 73. For example, the first gate stack line GSL4 may pass between a first bit line BL1 and a first source line SL1. In addition, the second gate stack line GSL5 may pass between the first source line SL1 and a third bit line BL3.

Figure 18:
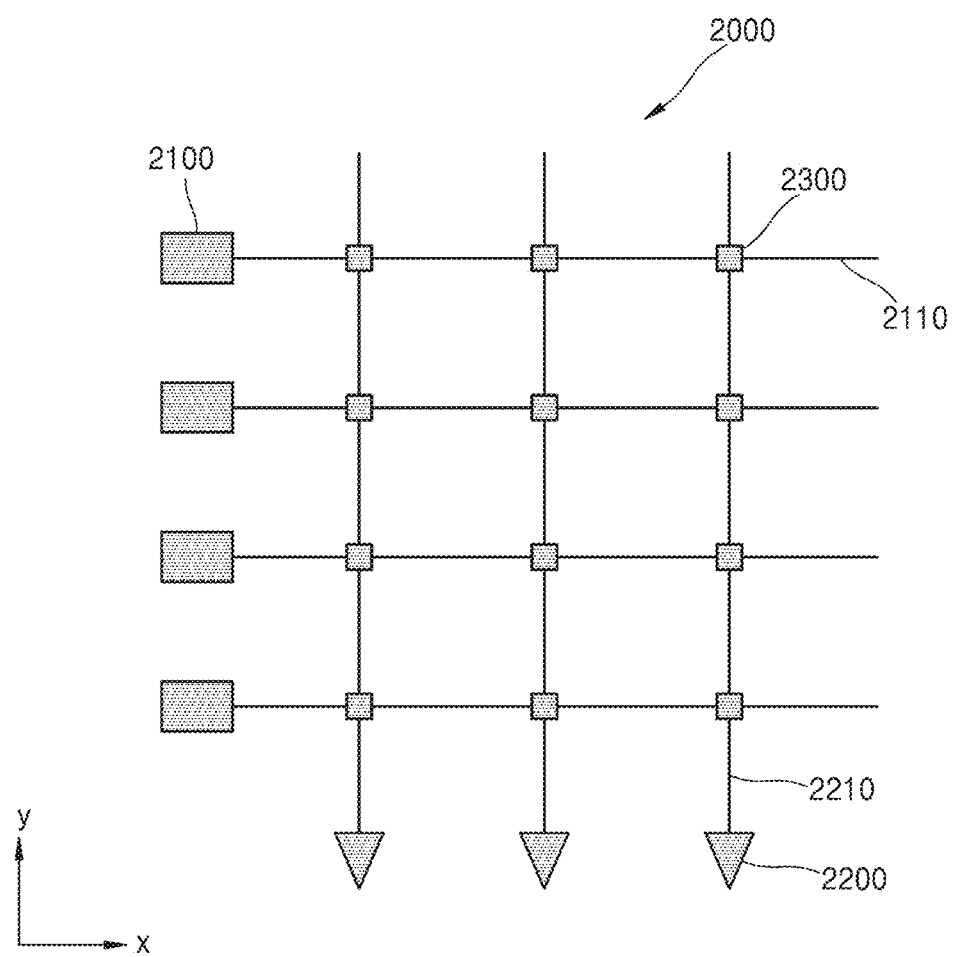
FIG. 18 is a view schematically illustrating an example configuration of a neuromorphic circuit according to some example embodiments.

FIG. 18 is a view schematically illustrating an example configuration of a neuromorphic circuit 2000 according to some example embodiments.

Referring to FIG. 18, the neuromorphic circuit 2000 may include pre-synaptic neuron circuits 2100, pre-synaptic lines 2110 extending in a first direction (for example, an x-axis direction) from the pre-synaptic neuron circuits 2100, post-synaptic neuron circuits 2200; post-synaptic lines 2210 extending in a second direction (for example, a y-axis direction) from the post-synaptic neuron circuits 2200, and synaptic circuits 2300 provided at intersections between the pre-synaptic lines 2100 and the post-synaptic lines 2200.

The pre-synaptic neuron circuits 2100 may include a first pre-synaptic neuron circuit and a second pre-synaptic neuron circuit, and the pre-synaptic lines 2110 may include a first pre-synaptic line extending in the first direction from the first pre-synaptic neuron and a second pre-synaptic line extending in the first direction from the second pre-synaptic neuron circuit. Alternatively or additionally, the post-synaptic neuron circuits 2200 may include a first post-synaptic neuron circuit and a second post-synaptic neuron circuit, and the post-synaptic lines 2210 may include a first post-synaptic line extending in the second direction from the first post-synaptic neuron circuit and a second post-synaptic line extending in the second direction from the second post-synaptic neuron circuit.

The pre-synaptic neuron circuits 2100 may transmit signals, which are input from the outside, to the synaptic circuits 2300 through the pre-synaptic lines 2110 in the form of electrical signals. In addition, the post-synaptic neuron circuits 2200 may receive electrical signals from the synaptic circuits 2300 through the post-synaptic lines 2210. In addition, the post-synaptic neuron circuits 2200 may transmit electrical signals to the synaptic circuits 2300 through the post-synaptic lines 2210.

Each of the synaptic circuits 2300 may include any one selected from the group consisting of or including the semiconductor devices 100, 110, and 120 described with reference to FIGS. 6 to 14.

The neuromorphic circuit 2000 described with reference to FIG. 18 is provided by simulating the structures of neurons and synapses, which are essential elements of the human brain. When a deep neural network (DNN) is realized using the neuromorphic circuit 2000, high-speed data processing and/or low power consumption may be more easily realized than the case of using a von Neumann architecture.

Figure 19:
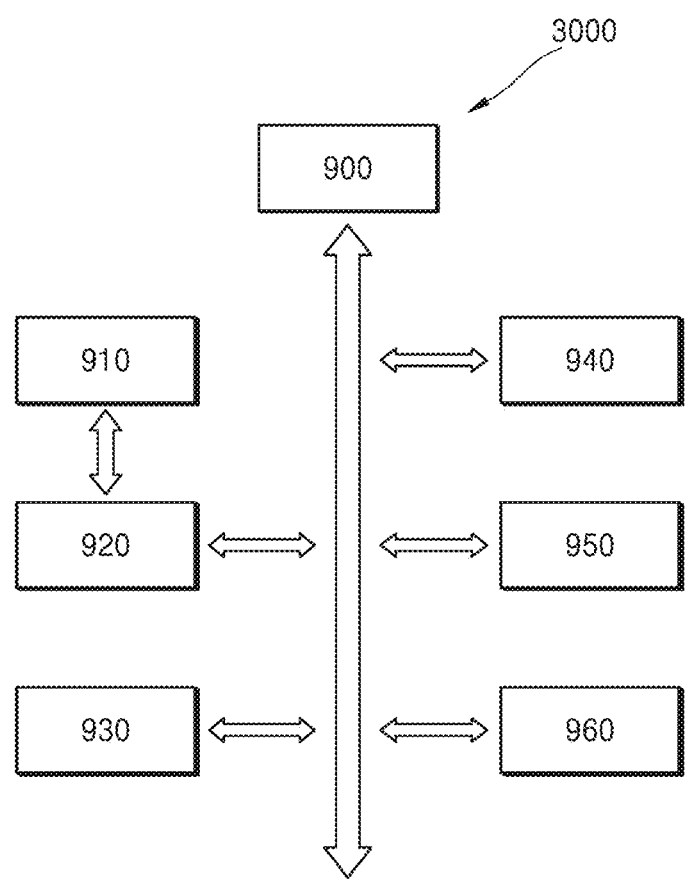
FIG. 19 is a view schematically illustrating a neuromorphic computing apparatus according to some example embodiments.

FIG. 19 is a view schematically illustrating a neuromorphic computing apparatus 3000 according to some example embodiments.

The neuromorphic computing apparatus 3000 is an asynchronous system capable of performing parallel operations by mimicking a neurobiological structure such as the human brain. Computing apparatuses of a related art, which have the von Neumann architecture, sequentially perform calculations and memory read/write operations and thus have a limited data processing speed.

The neuromorphic computing apparatus 3000 may extract valid information by analyzing input data in real time based on a neural network, and based on the extracted information, the neuromorphic computing apparatus 3000 may determine a situation or control components of an electronic device in which the neuromorphic computing apparatus 3000 is included. For example, the neuromorphic computing apparatus 3000 may be included in any one selected from the group consisting of or including drones, robot devices such as an advanced driver assistance system (ADAS), smart TVs, smartphones, medical devices, mobile devices, image display devices, measurement devices, Internet of Things (IoT) devices, and various other electronic devices.

Hereinafter, an example configuration of the neuromorphic computing apparatus 3000 having improved performance compared to von Neumann computing apparatuses will be described with reference to FIG. 19.

Referring to FIG. 19, the neuromorphic computing apparatus 3000 may include an input device 910 configured to receiving a data signal from the outside, a neuromorphic circuit 930 configured to store and output specific information by using the signal from the input device 910, and a processor 900 configured to process the information output from the neuromorphic circuit 930. In addition, the neuromorphic computing apparatus 3000 may further include an analog-to-digital converter 920, a memory device 940, a communication device 950, and an output device 960.

The processor 900 may control overall operations of the neuromorphic computing apparatus 3000. The processor 900 may include a single processor core (single core) or a plurality of processor cores (multiple cores). The processor 900 may process or execute programs and/or data stored in the memory device 940. In some example embodiments, the processor 900 may control functions of the neuromorphic circuit 930 by executing programs stored in the memory device 940. The processor 900 may be implemented as at least one of a central processing unit (CPU), a graphics processing unit (GPU), an application processor (AP), or the like.

The memory device 940 may store various programs executable by the processor 900. For example, the memory device 940 may include a volatile memory such as a dynamic random-access memory (DRAM) and/or a static random-access memory (SRAM). Alternatively or additionally, the memory device 940 may include a non-volatile memory such as a phase change random-access memory (PRAM), a magnetic random-access memory (MRAM), a resistive random-access memory (ReRAM), or a NAND flash memory. Alternatively or additionally, the memory device 940 may include a hard disk drive (HDD), a solid state drive (SDD), or the like.

The input device 910 may include at least one of a microphone, a camera, a scanner, a touch pad, a keyboard, a mouse, or various sensors. The various sensors may collect information around an electronic device in which the neuromorphic computing apparatus 3000 is included. The various sensors may sense and/or receive a signal (for example, at least one of an image signal, an audio signal, a magnetic signal, a biosignal, a touch signal, etc.) from the outside of the electronic device, and may convert the sensed or received signal into data. To this end, the various sensors may include at least one of various sensing devices such as a microphone, an imaging device, an image sensor, a light detection and ranging (LIDAR) sensor, an ultrasonic sensor, an infrared sensor, a biosensor, and a touch sensor. Various types of data such as voice data and image data may be input to the neuromorphic computing apparatus 3000 through the input device 910.

The analog-to-digital converter 920 may convert an analog signal received from the input device 910 into a digital signal.

The neuromorphic circuit 930 may include the neuromorphic circuit 2000 described with reference to FIG. 18. The neuromorphic circuit 930 may realize a DNN using data received from the analog-to-digital converter 920.

The communication device 950 may include various wired and/or wireless interfaces capable of communicating with external devices. For example, the communication device 950 may include at least one of: a wired local area network (LAN); a wireless local area network (WLAN) such as wireless fidelity (Wi-Fi); a wireless personal area network (WPAN) such as Bluetooth; a wireless universal serial bus (wireless USB); Zigbee; near field communication (NFC); radio-frequency identification (RFID); power line communication (PLC); or a communication interface connectable to a mobile cellular network such as a 3rd generation (3G), 4th generation (4G), 5th generation (5G), or long term evolution (LTE) cellular network.

The output device 960 may output signals in various forms. For example, the output device 960 may include at least one of a speaker, a printer, a monitor, a display panel, a beam projector, a hologrammer, and/or the like.

In some example embodiments, the neuromorphic computing apparatus 3000 of FIG. 19 may be applied to a machine learning system. The machine learning system may include various artificial neural network organizations and processing models, such as a convolution neural network (CNN), a repeated neural network (RNN) selectively including a deconvolution neural network, a long short-term memory (LSTM) unit, and/or a gated recurrent unit (GRU), a stacked neural network (SNN), a state-space dynamic neural network (SSDNN), a deep faith network (DBN), a generative adversarial network (GAN), and/or a restricted Boltzmann machine (RBM).

Alternatively or additionally, the machine learning system may include: other types of machine learning models, for example, linear and/or logistic regression, statistics clustering, Bayesian classification, determination trees, dimensional reduction such as main component analyses, expert systems, and/or random forests; or a combination thereof. The machine learning models may be used to provide various services and/or applications. For example, an image classification service, a user authentication service based on biometric information or biometric data, an advanced driver assistance system (ADAS) service, a voice assistance service, an automatic speech recognition (ASR) service, etc. may be executed by an electronic device.

As described above, various example embodiments may provide three-dimensional semiconductor devices having high endurance and an improved degree of integration, array structures of the semiconductor devices, neuromorphic circuits including the semiconductor devices, and computing apparatuses including the neuromorphic circuits.

Alternatively or additionally, various example embodiments may provide three-dimensional semiconductor devices having high endurance and an improved degree of integration that are manufacturable with low process difficulty by employing an insulating layer and a floating gate electrode layer which surround a semiconductor layer; array structures of the semiconductor devices; neuromorphic circuits including semiconductor devices; and computing apparatuses including the neuromorphic circuits.

Specific executions described herein are merely examples and do not limit the scope of the present disclosure in any way. For simplicity of description, descriptions of known electric components, control systems, software, and other functional aspects thereof may not be given. Furthermore, line connections and/or connection members between elements depicted in the drawings represent functional connections and/or physical or circuit connections by way of example, and in actual applications, they may be replaced or embodied as various additional functional connections, physical connections, or circuit connections.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that example embodiments described herein should be considered in a descriptive sense only and not for purposes of limitation. Descriptions of features or aspects within each example embodiment should typically be considered as available for other similar features or aspects in other example embodiments, and example embodiments are not necessarily mutually exclusive with one another. While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising:
a semiconductor layer extending in a first direction and comprising a source region and a drain region, which are apart from each other in the first direction;
an insulating layer surrounding the semiconductor layer;
a first gate electrode layer surrounding the insulating layer;
a ferroelectric layer on the first gate electrode layer; and
a second gate electrode layer on the ferroelectric layer,
wherein between the source region and the drain region, a ratio C2/C1 of a second capacitance C2 between the first gate electrode layer and the second gate electrode layer to a first capacitance C1 between the semiconductor layer and the first gate electrode layer is about 1/20 to about 1/5.

2. The semiconductor device of claim 1,
wherein the insulating layer and the first gate electrode layer have an all-around shape surrounding the semiconductor layer.

3. The semiconductor device of claim 1,
wherein a first ratio r1=ε1/t1 of a first dielectric constant ε1 of the insulating layer to a first thickness t1 of the insulating layer is equal to a second ratio r2=ε2/t2 of a second dielectric constant ε2 of the ferroelectric layer to a second thickness t2 of the ferroelectric layer.

4. The semiconductor device of claim 3,
wherein a ratio A2/A1 of a second area A2 of a surface of the ferroelectric layer, which contacts the first gate electrode layer between the source region and the drain region, to a first area A1 of a surface of the insulating layer, which contacts the first gate electrode layer between the source region and the drain region, is about 1/20 to about 1/5.

5. The semiconductor device of claim 1,
wherein a length of the ferroelectric layer in the first direction is about 10 nm to about 20 nm.

6. The semiconductor device of claim 1,
wherein a first length of the insulating layer in the first direction between the source region and the drain region is greater than a second length of the ferroelectric layer in the first direction between the source region and the drain region.

7. The semiconductor device of claim 1,
wherein a second width of the ferroelectric layer in a second direction crossing the first direction is equal to a third width of the first gate electrode layer in the second direction.

8. The semiconductor device of claim 1,
wherein a second width of the ferroelectric layer in a second direction crossing the first direction is greater than a third width of the first gate electrode layer in the second direction.

9. The semiconductor device of claim 1,
wherein a second length of the ferroelectric layer in the first direction is equal to a third length of the second gate electrode layer in the first direction.

10. The semiconductor device of claim 1,
wherein a second width of the ferroelectric layer in a second direction crossing the first direction is equal to a fourth width of the second gate electrode layer in the second direction.

11. The semiconductor device of claim 1,
wherein the semiconductor layer comprises:
a front surface and a rear surface, which are opposite each other in a second direction crossing the first direction; and
an upper surface and a lower surface, which are opposite each other in a third direction perpendicular to both the first direction and the second direction,
wherein the insulating layer surrounds the semiconductor layer and contacts the front surface, the rear surface, the upper surface, and the lower surface of the semiconductor layer.

12. The semiconductor device of claim 11,
wherein the first direction and the second direction are perpendicular to each other.

13. The semiconductor device of claim 11,
wherein the ferroelectric layer and the second gate electrode layer cover the first gate electrode layer on a side of the upper surface of the semiconductor layer.

14. The semiconductor device of claim 13,
wherein the ferroelectric layer and the second gate electrode layer extend to cover the first gate electrode layer on a side of the front surface and a side of the rear surface of the semiconductor layer.

15. A semiconductor device array structure comprising:
a plurality of gate lines side by side in a first direction and each extending in a second direction;
a plurality of semiconductor structures side by side in the second direction and crossing the plurality of gate lines, each of the plurality of semiconductor structures extending in the first direction; and
a plurality of ferroelectric structures between the plurality of gate lines and the plurality of semiconductor structures,
wherein each of the plurality of semiconductor structures comprises a semiconductor layer extending in the first direction and comprising a plurality of source regions and a plurality of drain regions which are apart from each other in the first direction, an insulating layer surrounding the semiconductor layer, and a first gate electrode layer surrounding the insulating layer,
between a first drain region and a first source region which are adjacent to each other among the plurality of source regions and the plurality of drain regions, a ratio C2/C1 of a second capacitance C2 between the first gate electrode layer and one of the plurality of gate lines, which is adjacent to the first gate electrode layer, to a first capacitance C1 between the semiconductor layer and the first gate electrode layer is about 1/20 to about 1/5.

16. The semiconductor device of claim 15,
wherein the plurality of ferroelectric structures are side by side in the first direction, and each of the plurality of ferroelectric structures extends in the second direction.

17. The semiconductor device of claim 15,
wherein the plurality of ferroelectric structures are apart from each other and at a plurality of crossing points between the plurality of gate lines and the plurality of semiconductor structures.

18. A neuromorphic circuit comprising:
a pre-synaptic neuron circuit;
a pre-synaptic line extending in a first direction from the pre-synaptic neuron circuit;
a post-synaptic neuron circuit;
a post-synaptic line extending from the post-synaptic neuron circuit in a second direction crossing the first direction; and
a synaptic circuit at an intersection between the pre-synaptic line and the post-synaptic line,
wherein the synaptic circuit comprises a semiconductor device comprising a semiconductor layer extending in the first direction and comprising a source region and a drain region, which are apart from each other in the first direction, an insulating layer surrounding the semiconductor layer, a first gate electrode layer surrounding the insulating layer, a ferroelectric layer on the first gate electrode layer, and a second gate electrode layer provided on the ferroelectric layer,
wherein between the source region and the drain region, a ratio C2/C1 of a second capacitance C2 between the first gate electrode layer and the second gate electrode layer to a first capacitance C1 between the semiconductor layer and the first gate electrode layer is about 1/20 to about 1/5.

19. The neuromorphic circuit of claim 18,
wherein a first ratio $r1=\varepsilon1/t1$ of a first dielectric constant $\varepsilon1$ of the insulating layer to a first thickness $t1$ of the insulating layer is equal to a second ratio $r2=\varepsilon2/t2$ of a second dielectric constant $\varepsilon2$ of the ferroelectric layer to a second thickness $t2$ of the ferroelectric layer, and
a ratio A2/A1 of a second area A2 of a surface of the ferroelectric layer, which contacts the first gate electrode layer between the source region and the drain region, to a first area A1 of a surface of the insulating layer, which contacts the first gate electrode layer between the source region and the drain region, is about 1/20 to about 1/5.

20. A neuromorphic computing apparatus comprising:
an input device;
the neuromorphic circuit of claim 18, the neuromorphic circuit being configured to store and output specific information based on a signal from the input device; and
a processor configured to process the information output from the neuromorphic circuit.

* * * * *